USO08260151B2

United States Patent
Pelley et al.

(10) Patent No.: US 8,260,151 B2
(45) Date of Patent: Sep. 4, 2012

(54) OPTICAL COMMUNICATION INTEGRATION

(75) Inventors: Perry H. Pelley, Austin, TX (US);
Dennis C. Hartman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1146 days.

(21) Appl. No.: 12/105,456

(22) Filed: Apr. 18, 2008

(65) Prior Publication Data
US 2009/0263143 A1 Oct. 22, 2009

(51) Int. Cl.
H04B 10/04 (2006.01)
(52) U.S. Cl. ........ 398/200; 398/182; 398/183; 398/164; 398/135; 398/192; 385/14; 385/147; 372/45; 372/20; 372/96; 372/50; 438/31; 438/42; 438/164; 438/46; 438/47; 257/79; 257/66; 257/72; 257/94; 257/99
(58) Field of Classification Search .................. 398/182, 398/183, 184, 185, 186, 187, 188, 189, 190, 398/191, 192, 200, 201, 141, 158, 159, 164, 398/79, 135, 136, 137, 138, 139, 202, 208, 398/209, 213, 214, 193, 194, 199, 128, 130; 385/1, 24, 37, 31, 14, 147, 129, 130, 88; 372/32, 34, 36, 38.02, 43.01, 45.01, 46.01, 372/45, 50, 20, 96, 102; 438/31, 42, 46, 438/47, 21, 164, 29; 257/66, 72, 94, 79, 257/84, 99, E33.066, E33.067
See application file for complete search history.

(56) References Cited

U.S. PATENT DOCUMENTS

| | | | |
|---|---|---|---|
| 4,862,474 A | 8/1989 | Morinaga et al. |
| 4,937,539 A | 6/1990 | Grinberg et al. |
| 5,151,814 A | 9/1992 | Grinberg et al. |
| 5,361,273 A | 11/1994 | Kosaka |
| 5,726,786 A | 3/1998 | Heflinger |
| 5,838,416 A | 11/1998 | Chen et al. |
| 6,002,507 A | 12/1999 | Floyd et al. |
| 6,246,708 B1 | 6/2001 | Thornton et al. |
| 6,289,145 B1 | 9/2001 | Solgaard et al. |
| 6,374,008 B2 | 4/2002 | Solgaard et al. |
| 6,410,941 B1 | 6/2002 | Taylor et al. |
| 6,441,360 B1 | 8/2002 | Bishop et al. |

(Continued)

FOREIGN PATENT DOCUMENTS
WO 9835378 A1 8/1998

OTHER PUBLICATIONS

M. Last et al., "Toward a Wireless Optical Communication Link between Two Small Unmanned Aerial Vehicles", Berkeley Sensor and Actuator Center.

(Continued)

*Primary Examiner* — Hanh Phan
(74) *Attorney, Agent, or Firm* — David G. Dolezal

(57) ABSTRACT

An integrated circuit die has a transistor circuitry section for implementing information handling operations. Optical circuitry is within the single semiconductor die. The optical circuitry includes a laser transmitter and is operably coupled to the transistor circuitry section. The transistor circuitry section originates information. The optical circuitry transmits the information in a laser beam through a wave guide to the edge of the integrated circuit die.

20 Claims, 20 Drawing Sheets

U.S. PATENT DOCUMENTS

| | | | |
|---|---|---|---|
| 6,462,847 | B2 | 10/2002 | Willebrand |
| 6,466,349 | B1 * | 10/2002 | Valley et al. ............ 398/182 |
| 6,526,195 | B1 | 2/2003 | Henshall et al. |
| 6,532,093 | B2 | 3/2003 | Sun et al. |
| 6,580,858 | B2 | 6/2003 | Chen et al. |
| 6,618,184 | B2 | 9/2003 | Jin et al. |
| 6,711,318 | B2 | 3/2004 | Hamerly et al. |
| 6,830,221 | B1 | 12/2004 | Janson et al. |
| 7,058,307 | B2 | 6/2006 | Sakanaka |
| 7,146,105 | B1 | 12/2006 | Tzeng et al. |
| 7,180,929 | B2 | 2/2007 | Kuzma |
| 2003/0007533 | A1 | 1/2003 | Bosco et al. |
| 2005/0078902 | A1 * | 4/2005 | Beausoleil et al. ............ 385/1 |
| 2010/0266295 | A1 * | 10/2010 | Zheng et al. ............ 398/201 |

OTHER PUBLICATIONS

B. Apter et al., "Electrooptical Wide-Angle Beam Deflector Based on Fringing-Field-Induced Refractive Inhomogeneity in a Liquid Crystal Layer", IEEE, 240-243, Israel.

Kaigham J. Gabriel, "Microelectromechanical Systems (MEMS) Tutorial", IEEE, Paper 17.1, pp. 432-441.

B. Fracasso et al., "Design and Performance of a Versatile Holographic Liquid-Crystal Wavelength-Selective Optical Switch", Journal of Lightwave Technology, vol. 21, No. 10, Oct. 2003.

R. Colin Johnson, "Intel demos 40-Gbit/s Si laser", Electronic Engineering Times, Aug. 27, 2007, p. 6.

H.M. Dauplaise et al., "Evaporated Thin Silicon Interlayers for Indium Phosphide Device Applications", Rome Laboratory, Hanscom Air Force Base, MA, pp. 293-296.

Dean Samara-Rubio et al., "Customized Drive Electronics to Extend Silicon Optical Modulators to 4 Gb/s", Journal of Lightwave Technology, vol. 23, No. 12, Dec. 2005, pp. 4305-4314.

John E. Bowers et al., "Hybrid Silicon Evanescent Laser in a Silicon-on-Insulator Waveguide", University of California and Intel Corporation, Optical Society of America 2006.

R. Baets et al., "Silicon Photonics", Ghent University—IMEC, Department of Technology, IEEE, 2007.

Joost Brouckaert et al., "Thin-Film III-V Photodetectors Integrated on Silicon-on-Insulator Photonic ICs", Journal of Lightwave Technology, vol. 25, No. 4, Apr. 2007, pp. 1053-1060.

G. Roelkens et al., "Ultra-thin benzocyclobutene bonding of III-V dies onto SOI substrate", Electronics Letters, Apr. 28, 2005, vol. 41, No. 9.

D. Van Thourhout et al., "Technologies for On-Chip Optical Interconnects", IMEC—Ghent University, IEEE, pp. 204-205.

Gunther Roelkens et al., "Heterogeneous integration of III-V photodetectors and laser diodes on silicon-on-insulator waveguide circuits", Ghent University—IMEC, Department of Information Technology, IEEE. pp. 188-190.

R. Baets et al., Silicon-on-Insulator based Nano-photonics: Why, How, What for?, Ghent University—IMEC, Department of Information Technology, pp. 1-3.

Non-Published U.S. Appl. No. 12/105,423, Free-Space Optical Communication System, filed Apr. 18, 2008, showing Perry H. Pelley as the first named inventor.

PCT Search Report and Written Opinion, PCT/US2009/034091, Mailed Sep. 23, 2009.

* cited by examiner

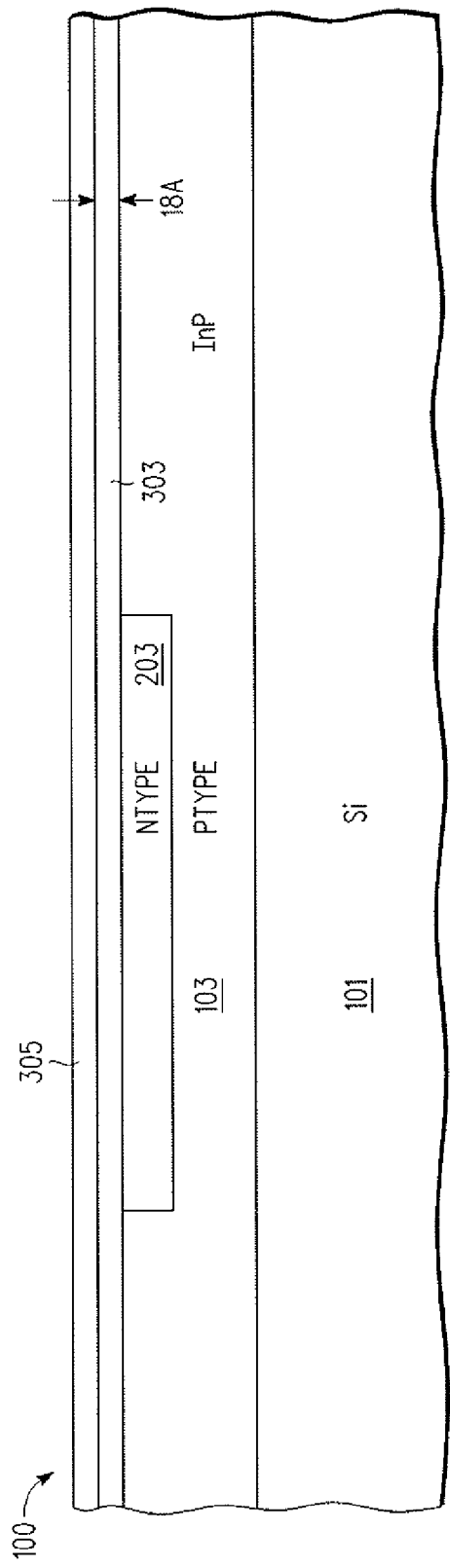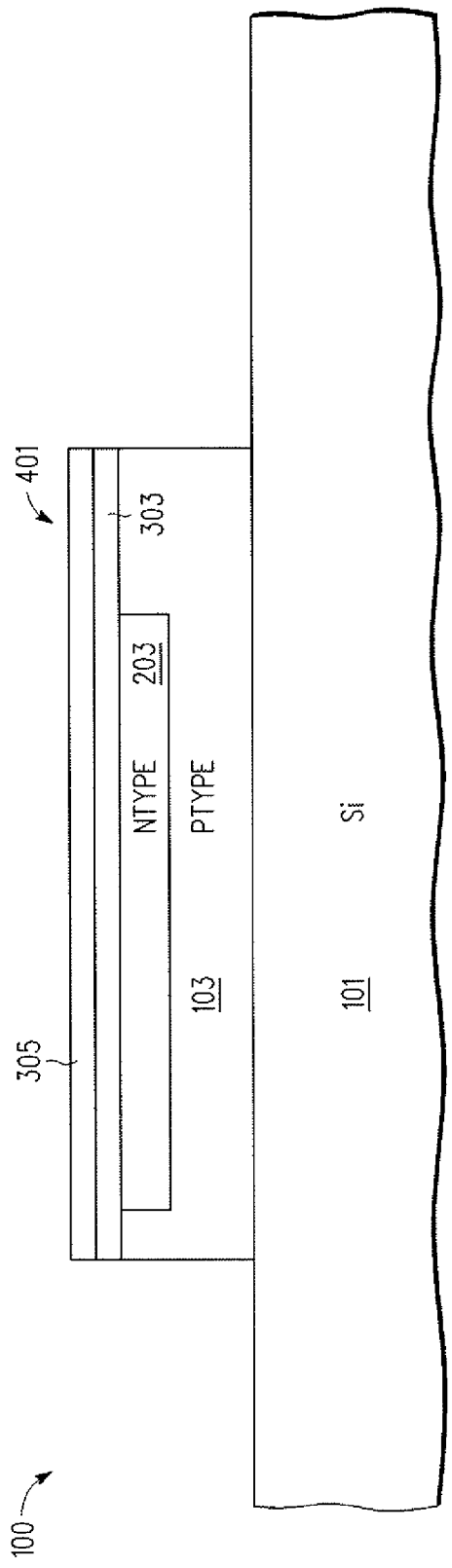

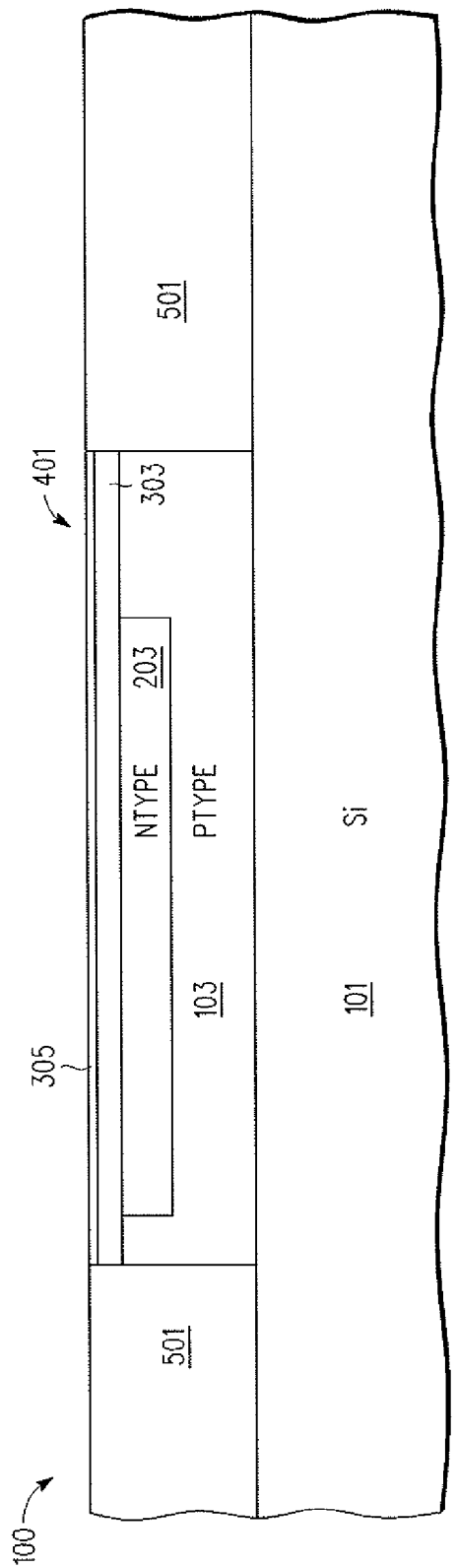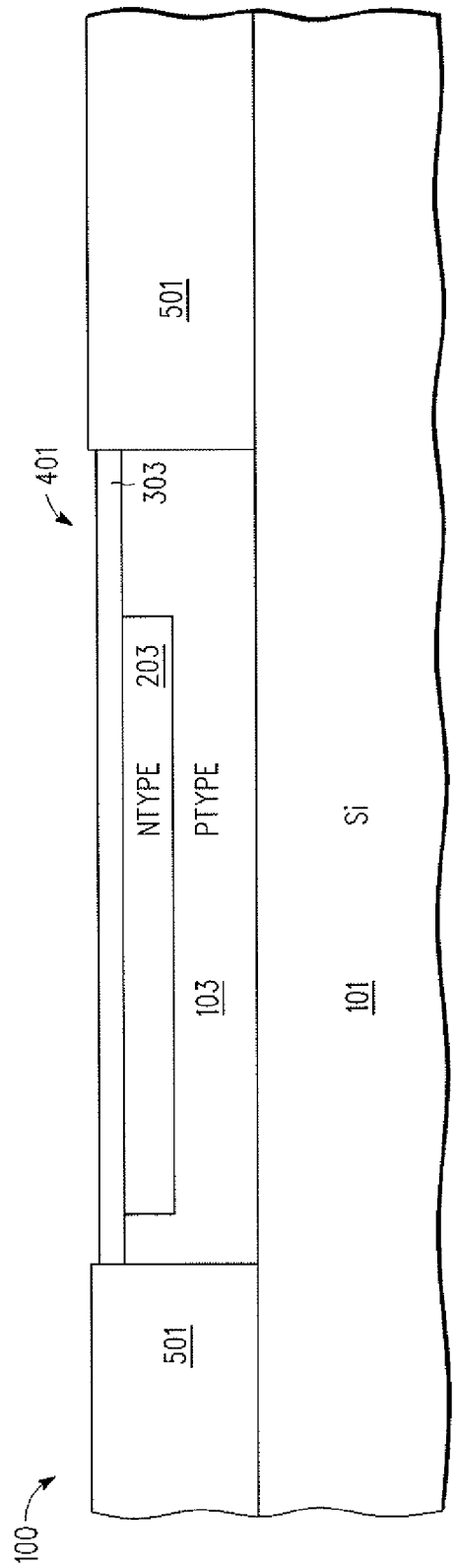

OPTICAL COMMUNICATION INTEGRATION

BACKGROUND OF THE INVENTION

1. Field of the Invention

This invention relates in general to integrated circuits and more specifically to optical communication by integrated circuits.

2. Description of the Related Art

In information systems, information is communicated between devices. One way of communicating information is through an optical communication system. With some examples of optical communication systems, a laser beam is modulated to encode information for transferring the information to other devices of the system. In one embodiment, one integrated circuit generates information that is to be transferred to another integrated circuit of the system.

Laser diodes for generating the laser beam are typically made of different materials and processes than the circuitry that generates the information. For example, a processor core or other type of logic circuitry that generates information may be made by a CMOS process wherein the laser diode is made of Indium Phosphide or other material. Accordingly, these devices are located in different integrated circuit die wherein electrical connecters carry the signals between the die. The different processes and materials for making the two devices make integration of the devices extremely difficult at a practical level.

BRIEF DESCRIPTION OF THE DRAWINGS

The present invention may be better understood, and its numerous objects, features, and advantages made apparent to those skilled in the art by referencing the accompanying drawings.

FIGS. 1-22 are partial cutaway side views of various stages in the production of an integrated circuit die including both a laser transmitter and transistor circuitry according to one embodiment of the present invention.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, FIGS. 1-22 are partial cutaway side views showing various stages in a process for forming an integrated circuit die that includes both a laser transmitter and transistor circuitry that generates information to be transmitted by the laser transmitter.

Figure 1:
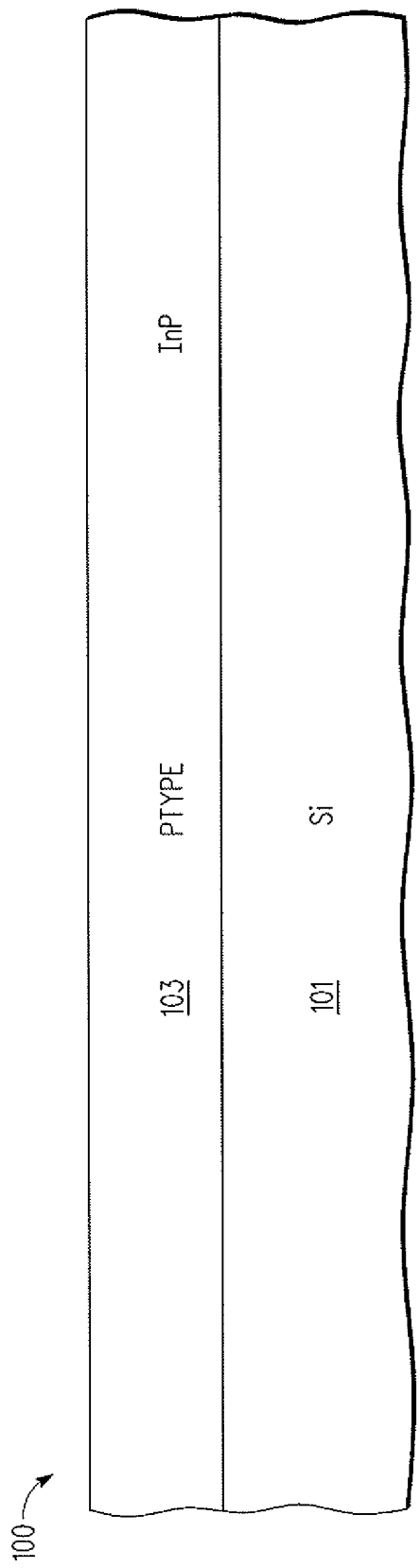

FIG. 1 is a partial cutaway side view of a carrier wafer 100. In one embodiment, wafer 100 includes a bulk silicon substrate 101 of monocrystalline silicon, but may be made of other materials in other embodiments. A layer 103 of Indium Phosphide is formed over substrate 101. In one embodiment, layer 103 is formed by a deposition process such as e.g. an epi-deposition process, a chemical vapor deposition (CVD) process, or a physical vapor deposition (PVD) process. In one embodiment, layer 103 is doped with a P-type dopant (e.g. zinc) which maybe doped in situ, by spin-on glass doping, or by ion implantation subsequent to the formation of layer 103. In other embodiments, substrate 101 may be made of other materials and/or formed by other methods. In one embodiment, layer 103 has a thickness of 0.5 to 4 microns, but may have other thicknesses in other embodiments.

Figure 2:
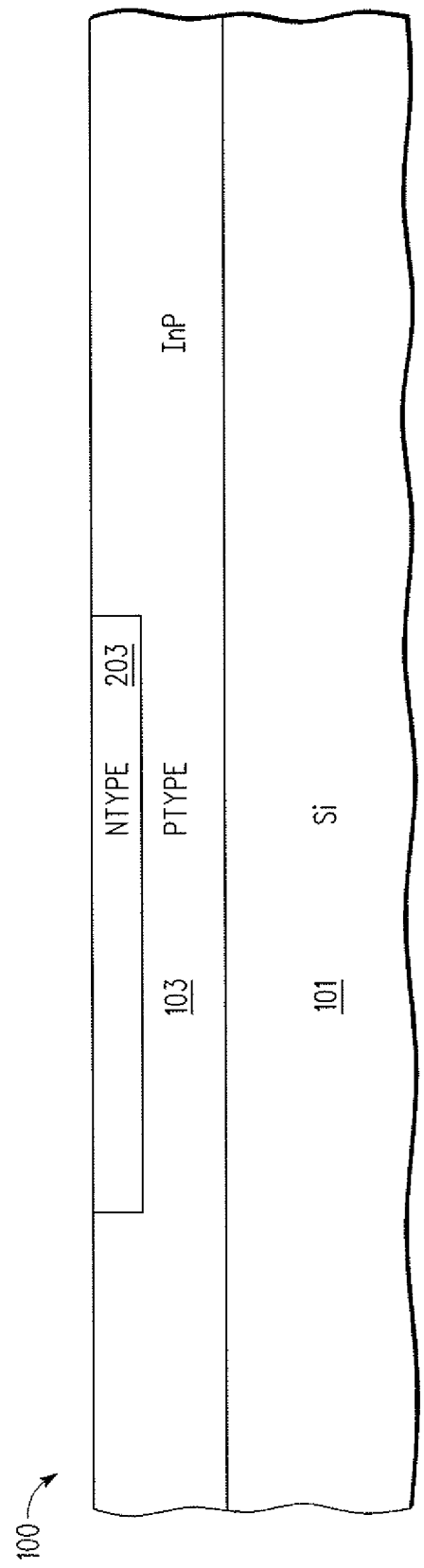

FIG. 2 is a cutaway side view of wafer 100 after N-type region 203 is formed in layer 103. N-type region 203 is formed in one embodiment by doping region 203 with an N-type dopant (e.g. sulfur).

FIG. 3 shows wafer 100 after a dielectric layer 303 (e.g. $SiO_2$) and a layer 305 of silicon nitride are formed on wafer 100. In one embodiment, layer 303 is deposited by a CVD or PVD processes. In one embodiment, layer 303 has a thickness sized to provide a predetermined thickness between N-type region 203 and a subsequently formed laser cavity. In one embodiment, the thickness of layer 303 is 18 Å, but may be of other thicknesses in other embodiments. In one embodiment, layer 305 is used as a planarization stop in subsequent processes. In one embodiment, layer 305 is made of silicon nitride but may be made of other materials in other embodiments. In one embodiment, layer 305 has a thickness of 500 Å or less, but may be of other thicknesses in other embodiments. In some embodiments, it is preferable for layer 305 to be as thin as possible.

FIG. 4 is a side view of wafer 100 after layers 103, 303, and 305 have been patterned to form a laser diode island structure 401. Structure 401 includes a P-type region (the remaining portion of layer 103) and an N-type region 203. When these junctions are biased at different voltages, photons at a particular wave length are produced.

FIG. 5 shows a side view of wafer 100 after dielectric layer 501 is formed around structure 401 to isolate structure 401 laterally. In one embodiment, layer 501 is a layer of silicon dioxide. In one embodiment, a layer of silicon dioxide is deposited (e.g. CVD or other deposition process) over wafer 100 followed by a planarization (e.g. a chemical mechanical polish (CMP)) of wafer 100 that utilizes layer 305 as a planarization stop. It may be preferable in some embodiments in forming layer 501 to minimize process temperature (e.g. below 350° C.) in order to preserve the integrity of the laser diode in structure 401.

FIG. 6 is a cutaway side view of wafer 100 after layer 305 has been removed (e.g. with a hot phosphoric acid). In the embodiment shown, layer 305 is of a minimal thickness (e.g. 10 Å or less) after the planarization such that its removal does not form a very deep recess in the surface of wafer 100.

Although only one laser diode structure 401 is shown in FIG. 6, wafer 100 may include a number of layer diode structures isolated from each other by layer 501.

Figure 7:
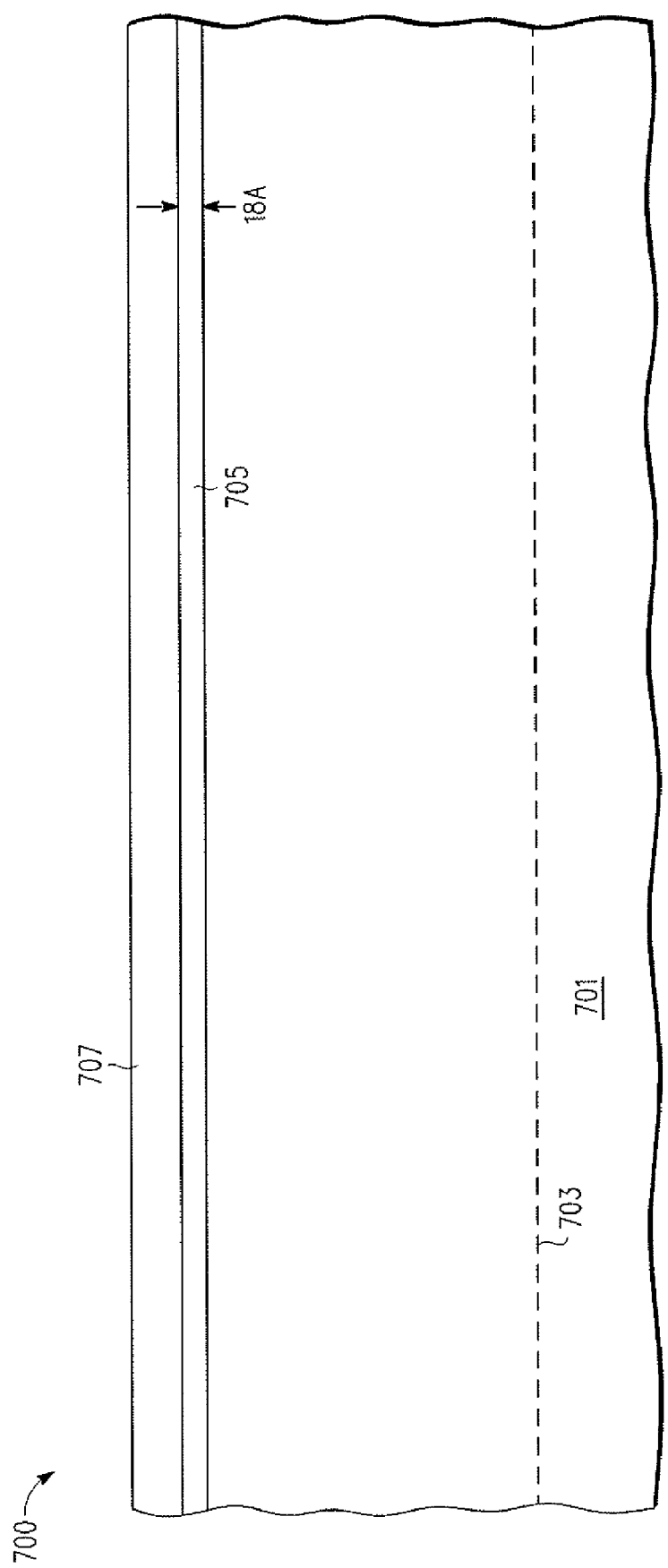

FIG. 7 is a cutaway side view of a donor wafer 700. Wafer 700 includes a substrate layer 701 that, in the embodiment shown, is of monocrystalline bulk silicon. Hydrogen ions have been ion implanted into substrate layer 701 at a predetermined depth to form a cleave line for subsequent separation. In one embodiment, cleave line 703 is formed at a depth of 9300 Å, but may be at other depths in other embodiments. The depth of cleave line 703 is set in one embodiment as the thickness of a subsequently formed wave guide structure. In other embodiments, substrate layer 701 may be of other materials.

Wafer 700 includes a layer 705 of silicon oxide which may be deposited or thermally grown. In one embodiment, layer 705 has a thickness that is roughly one half of the separation between a laser diode and a laser cavity wave guide. In the embodiment shown, layer 705 is 18 Å thick. A planarization stop layer 707 is formed over layer 705. In one embodiment, layer 707 is made of silicon nitride and is deposited by a deposition process (e.g. CVD or PVD). In one embodiment, it is preferable to make layer 707 as thin as possible and still have a minimal amount left after planarization. In one embodiment, layer 707 is 500 Å or less, but may be of other thicknesses in other embodiments.

Figure 8:
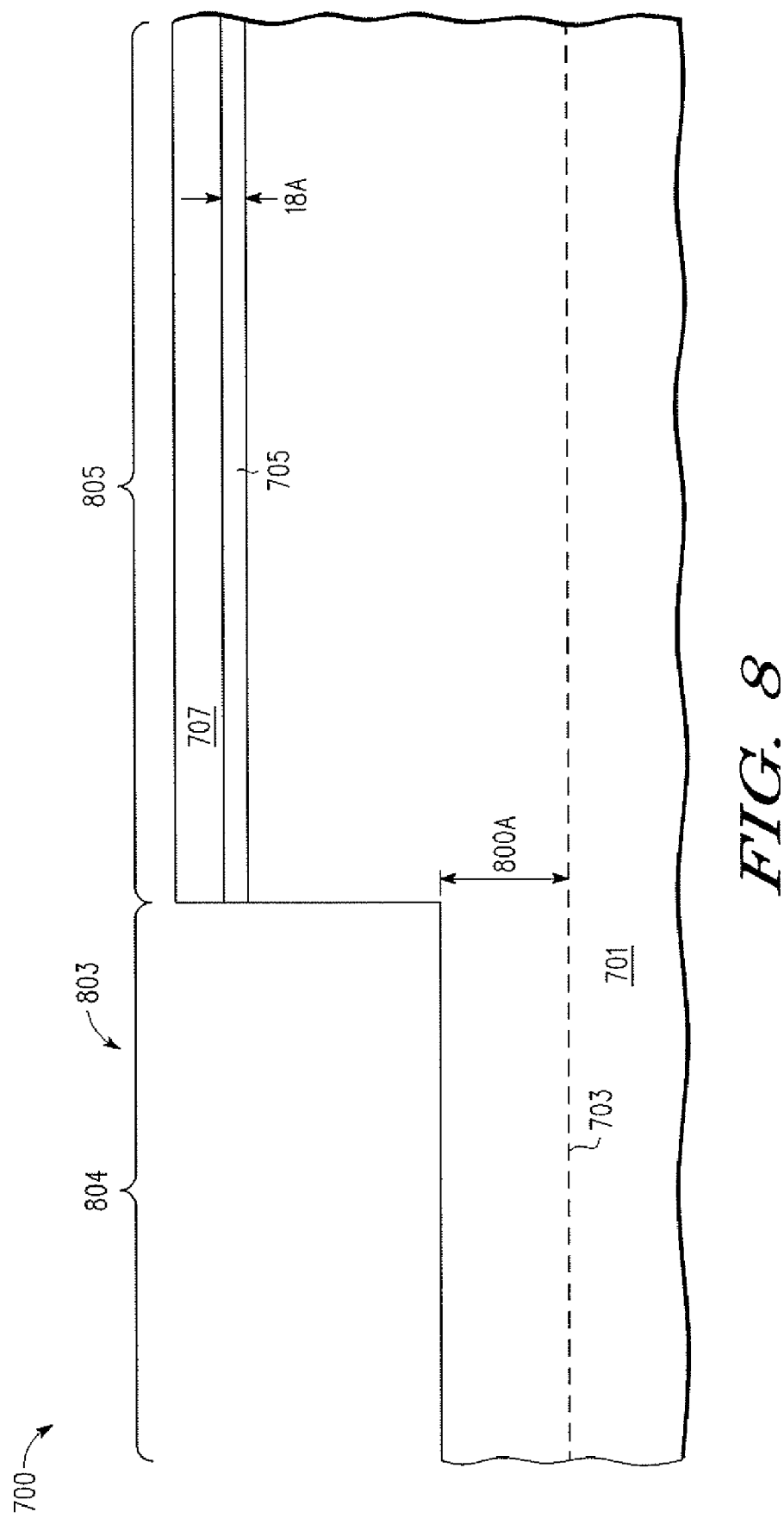

FIG. 8 shows a cutaway side view of wafer 700 after a portion of substrate layer 701 has been removed to form recess 803 in transistor circuitry section 804 of wafer 700. In one embodiment, recess 803 is at a depth where the bottom of recess 803 is approximately 800 Å from cleave line 703. In one embodiment, recess 803 is formed by forming a mask (not shown) of e.g. of photo resist or other masking material and patterning the material to protect optical section 805 and expose section 804. The material of layers 707 and 705 are removed form section 804 by etching with appropriate etch chemistries.

In one embodiment, the material of section 804 is removed to a particular depth by an anisotropic timed etch that is selective with respect to the masking material. In one embodiment, a chlorine containing etch chemistry or more generally a halogen containing etch chemistry maybe used, but other etch chemistries for etching silicon (or other material of layer 701) may be used. In one embodiment, it is preferable that the bottom of recess 803 be as uniform as possible.

The formation of recess 803 allows for thinner active regions for subsequently formed transistors. These thinner regions provide for improved transistor performance in some embodiments. Forming recess 803 allows for the formation of transistors from the same material as the subsequently formed wave guide structures in section 805, and yet be formed in a thinner active layer. However, in other embodiments, recess 803 would not be formed in section 804.

Figure 9:
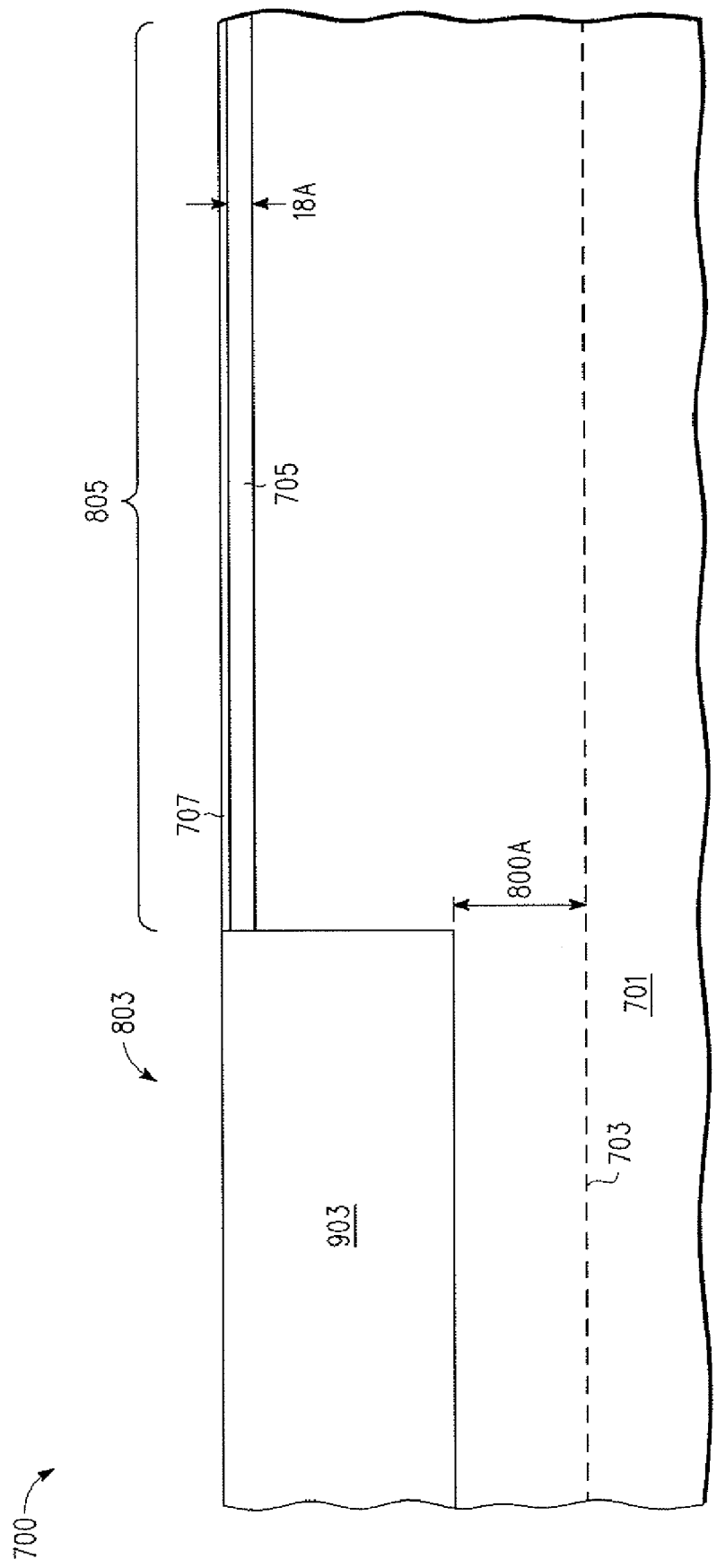

FIG. 9 shows a cutaway side view of wafer 700 after a silicon dioxide layer 903 is formed in recess 803. Layer 903 is formed by depositing a silicon dioxide over wafer 700 and then subsequently planarizing wafer 700 using layer 707 as a planarizing stop. In one embodiment, layer 707 is planarized so that a minimal thickness remains (e.g. 10 Å or less).

Figure 10:
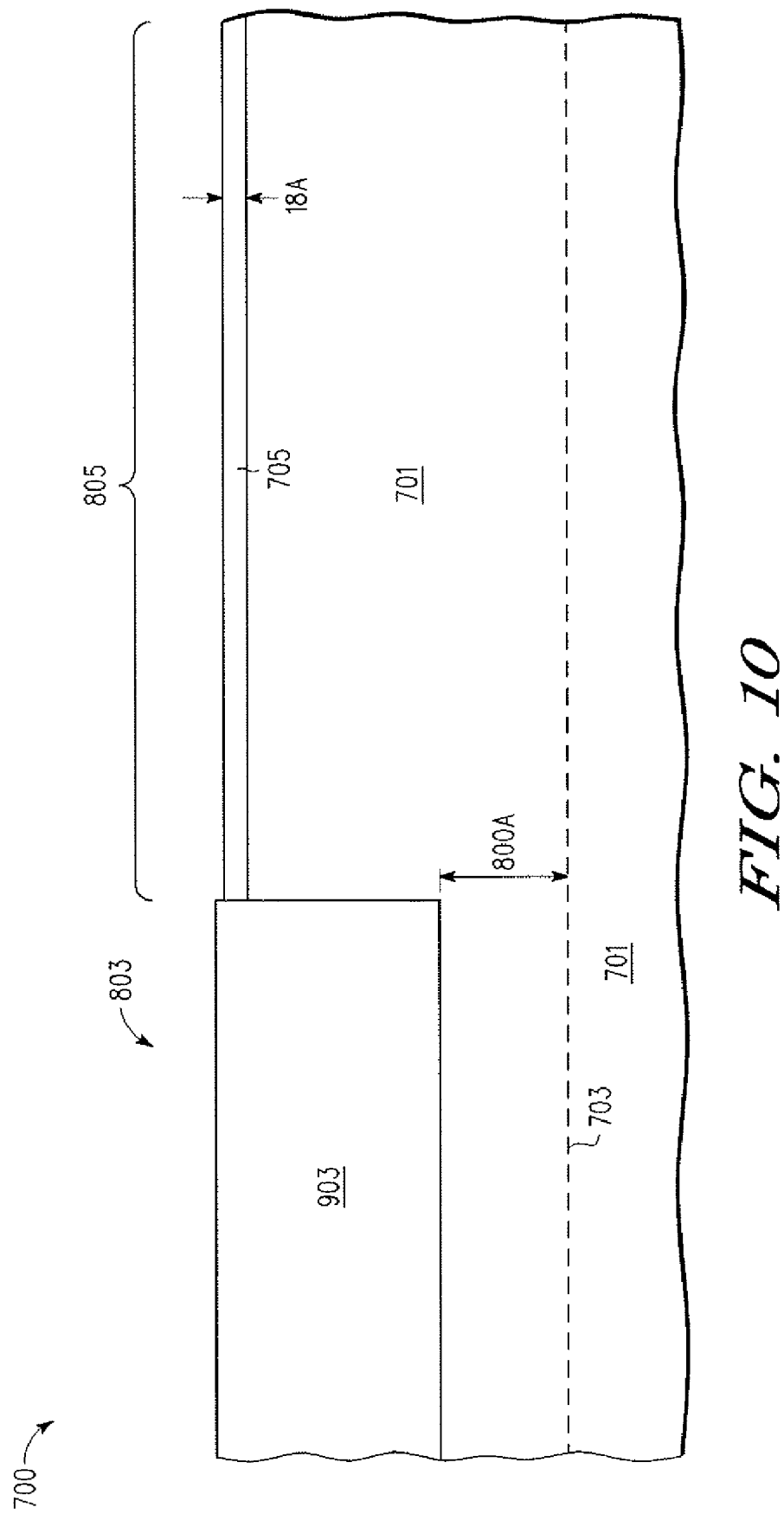

FIG. 10 shows a cutaway side view of wafer 700 after layer 707 has been removed. In the embodiment, layer 707 is of a minimal thickness (10 Å or less) after the planarization such that its removal does not form a very deep recess in the surface of wafer 700.

Figure 11:
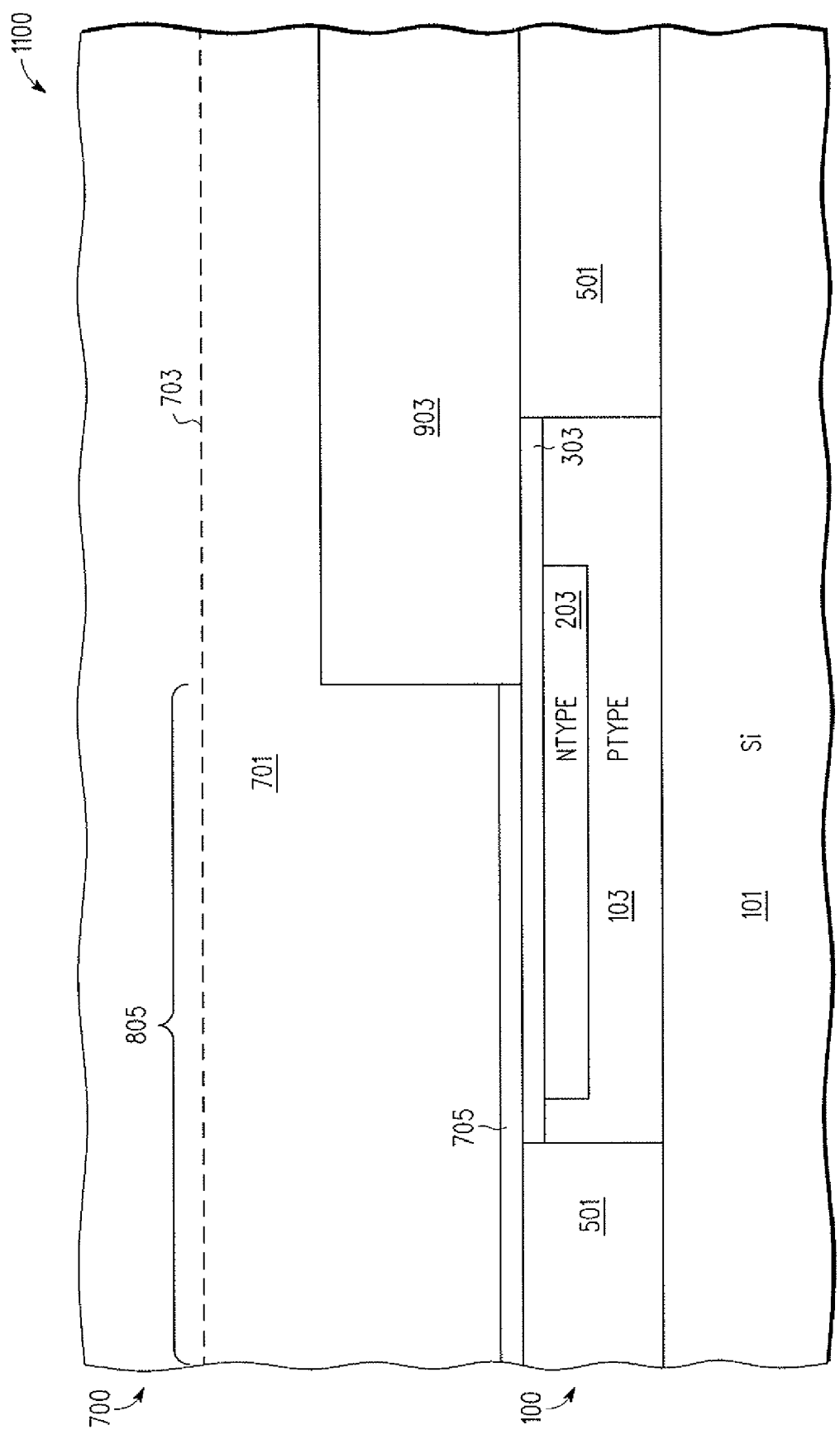

FIG. 11 shows a cutaway side view after wafer 700 has been inverted and bonded to wafer 100 to form a resultant wafer 1100. In one embodiment, wafer 700 is bonded to wafer 100 by placing the wafers in an aligned position with each other and applying pressure to the wafers under an elevated temperature to bond the silicon dioxide layers 705, 903, 501, and 303 together. In one embodiment, the wafers are bonded together by a process used by SOITEC of Grenoble France to produce semiconductor on insulator (SOI) wafers. In one embodiment, the wafers are aligned with the use of alignment marks (not shown) but may be aligned by other processes in other embodiments. In some embodiments, the bondable surfaces of wafers 100 and 700 maybe subjected to a cleaning process and a polishing process prior to bonding.

Figure 12:
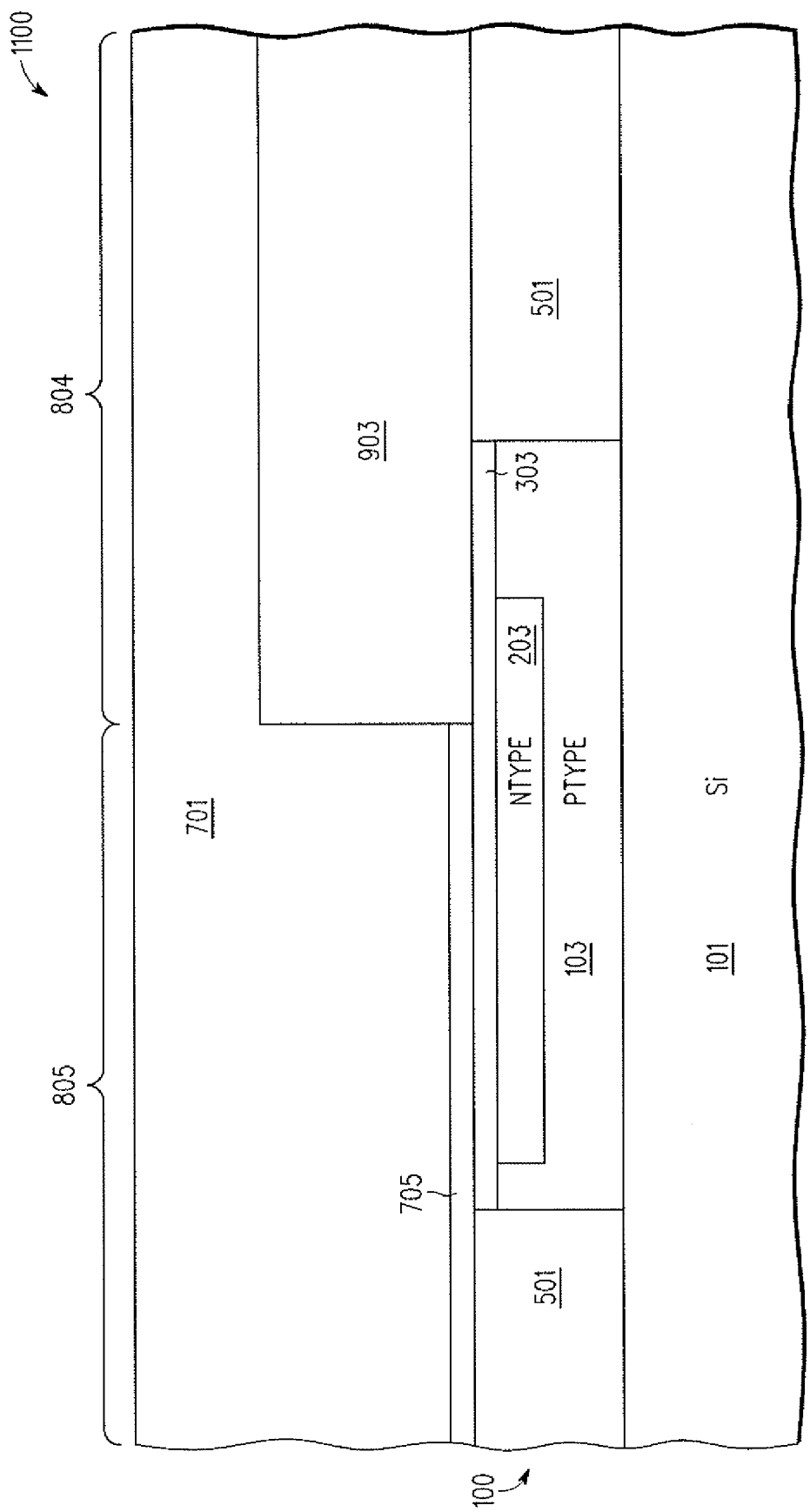

FIG. 12 is a cutaway side view of wafer 1100 after a portion of substrate layer 701 is removed at cleave line 703.

Figure 13:
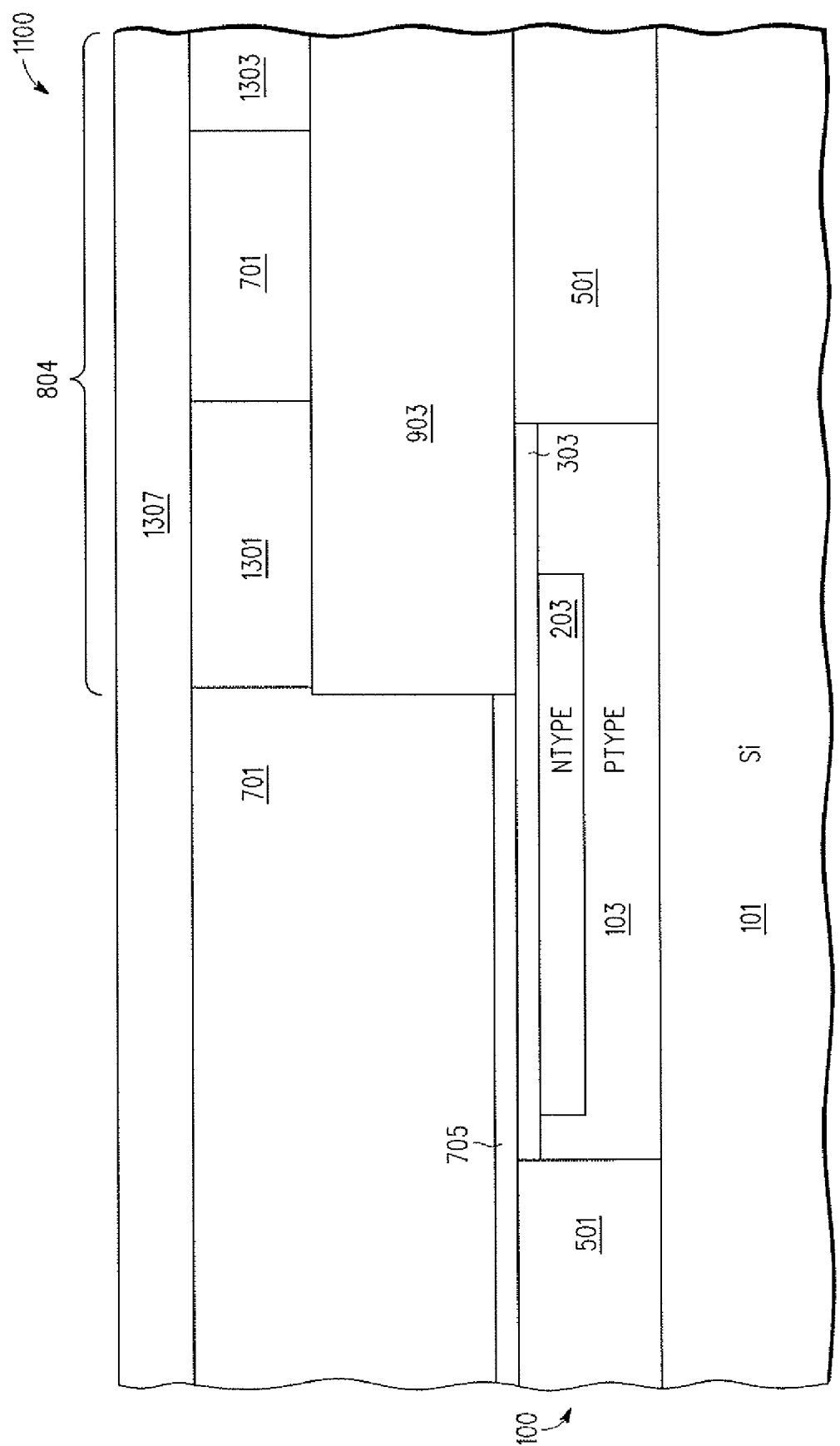

FIG. 13 shows a cutaway side view of wafer 1100 after trench isolation structures 1301 and 1303 are formed in transistor section 804 followed by the formation of planarization layer 1307 over wafer 1100. In one embodiment, trench isolation structures 1301 and 1303 are formed by forming openings in layer 701 in section 804 followed by the deposition of a dielectric material (e.g. SiO$_2$) and subsequent planarization.

Not shown in FIG. 13 is a silicon oxide and silicon nitride bi-layer that is used as a polish stop layer during the planarization process to form structures 1301 and 1303.

In one embodiment, layer 1307 has a thickness in the range of 500 Å or less, but may be of other thicknesses in other embodiments. In one embodiment, layer 1307 may include a thin layer of silicon oxide (e.g. 10 Å) and a thicker layer of silicon nitride formed over the layer of silicon oxide.

Figure 14:
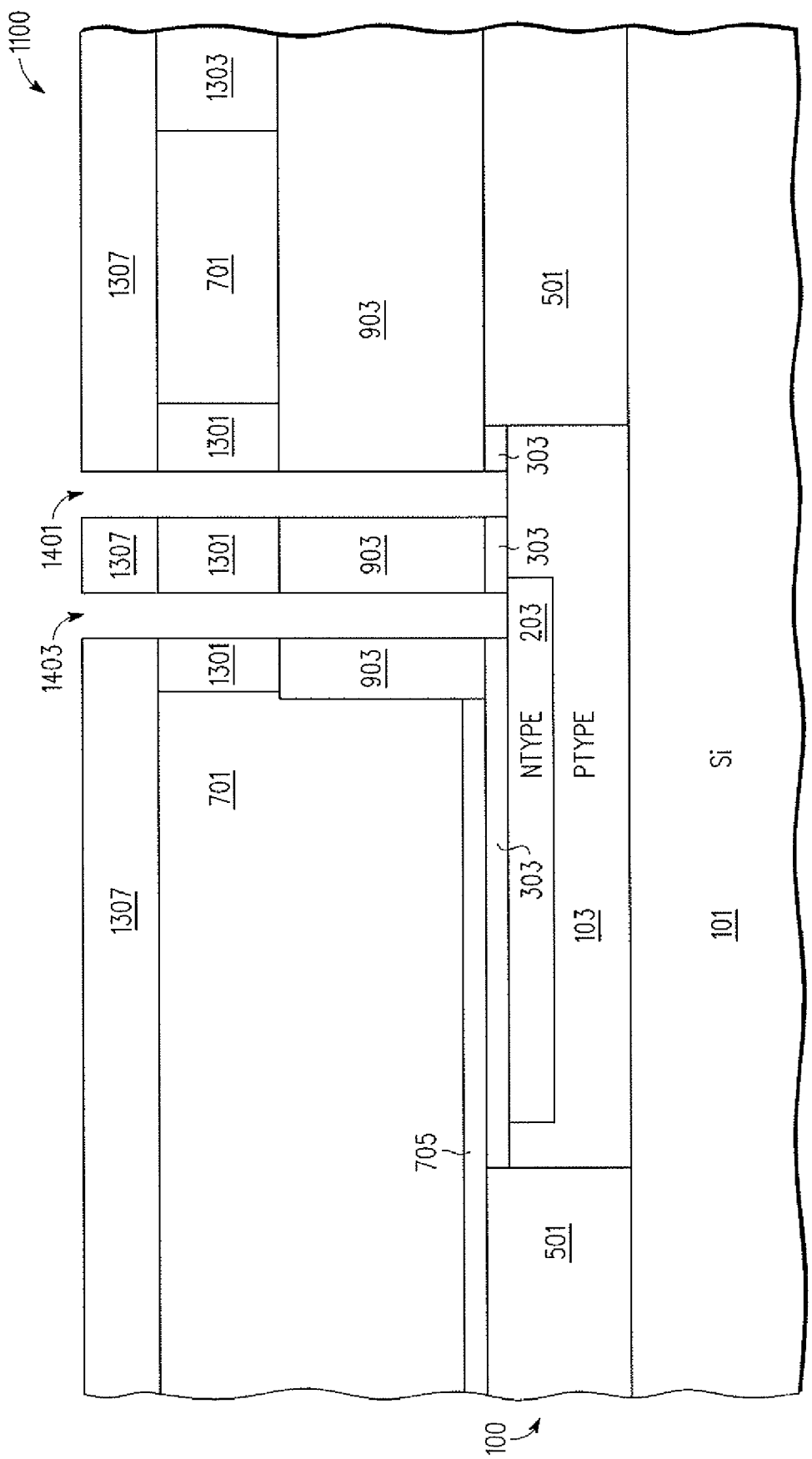

FIG. 14 shows a cutaway side view of wafer 1100 after openings 1401 and 1403 are formed for forming contacts to P type layer 103 and N type region 203, respectively. In one embodiment, openings 1401 and 1403 are formed by patterning openings in layer 1307 (e.g. using a photolithographic process) and etching oxide structures 1303, 903 and layer 303 with appropriate anisotropic etch chemistries (e.g. $CHF_3$, $C_2F_6$, or $C_4F_8$ and argon gas) for etching silicon dioxide. Other similar mixtures of fluorocarbons (with or without hydrogen) may be used to etch the silicon dioxide.

Figure 15:
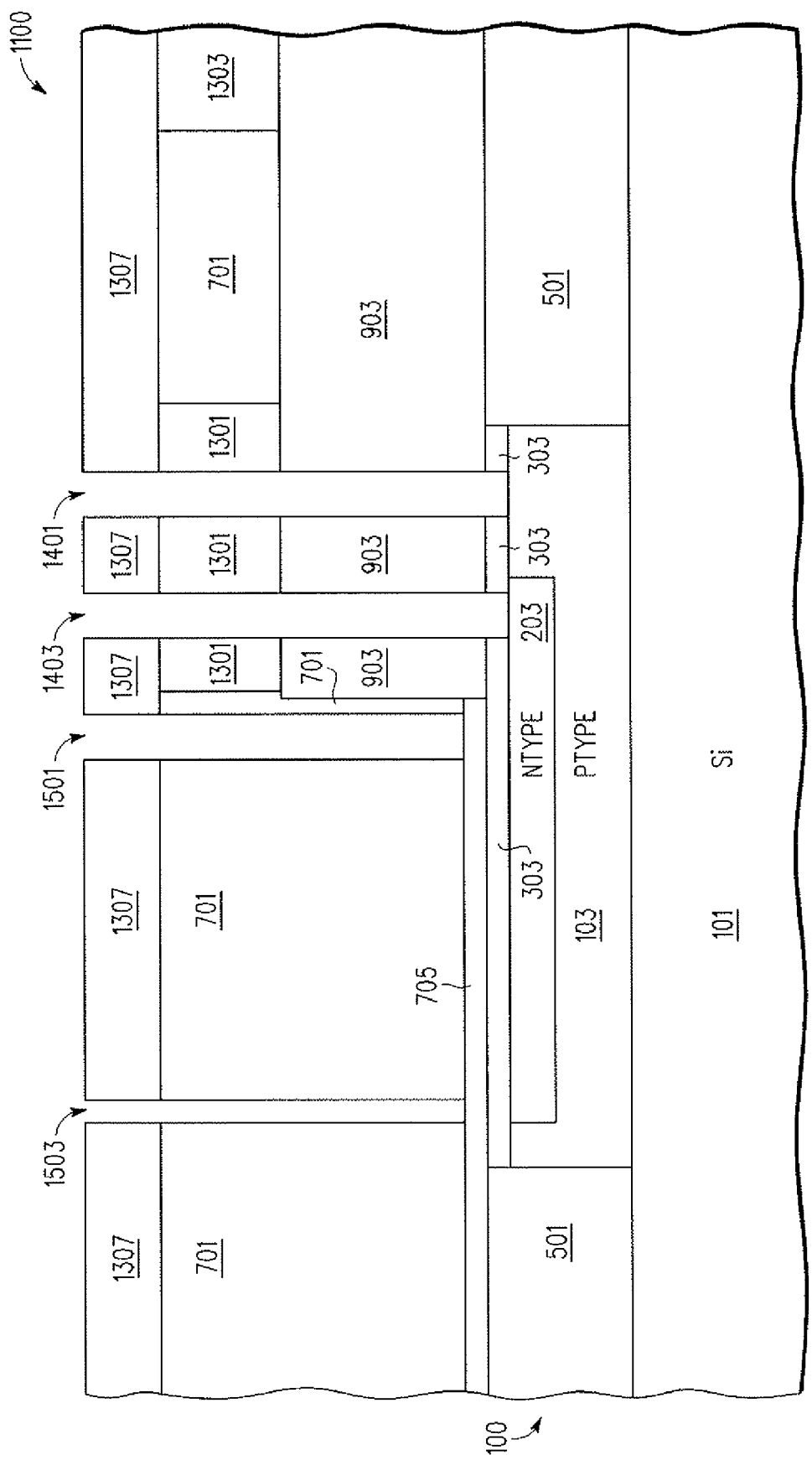

FIG. 15 is a cutaway side view of wafer 1100 after openings 1503 and 1501 are formed in wafer 1100 for forming mirror structures. In the embodiment shown, openings 1503 and 1501 are formed by forming openings in layer 1307 (e.g. by a photolithographic processes) and using an anisotropic etch chemistry that etches the silicon of layer 701 and is etch selective to the masking structures and layer 705. Openings 1501 and 1503 extend to layer 705. While openings 1501 and 1503 are being formed, openings 1403 and 1405 are filled with a masking material. In one embodiment, the width of mirror structure opening 1501 is bigger than the width of opening 1503 in that opening 1501 is for forming a full mirror structure and opening 1503 is for forming a half mirror structure.

Figure 16:
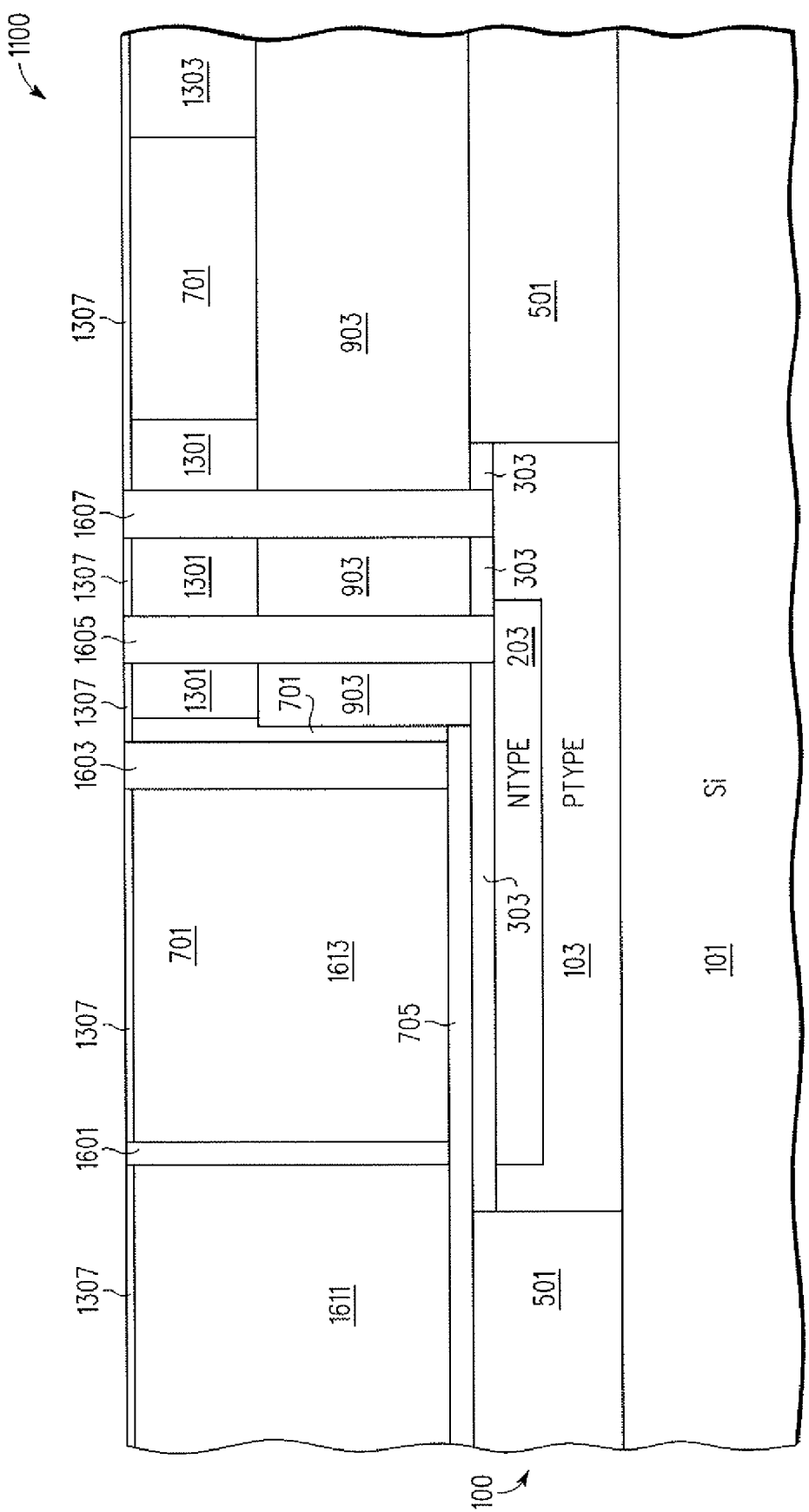

FIG. 16 is a cutaway side view of wafer 1100 after diode contacts 1605 and 1607 and mirror structures 1601 and 1603 are formed. In one embodiment, these structures are formed by depositing a layer of material (e.g. tungsten) followed by planarizing wafer 1100 to remove material that is outside of the openings to complete the in-laid process. In one embodiment, forming these structures may include a forming a barrier layer material (e.g. titanium, tantalum, or nitrides thereof) followed by depositing the layer of tungsten. The widths of full mirror structure 1603 and half mirror structure 1601 depend on the wavelength of the laser beam and the mirror material.

In the embodiment shown, the mirror structures and contacts are formed of the same material (e.g. tungsten) that is both electrically conductive and reflective. In other embodiments, contacts 1605 and 1607 may be formed of a different material than that of full mirror structure 1603 and half mirror structure 1601. For example the mirror structures may be formed from chrome, nickel, titanium, and or tantalum. However, utilizing the same material as that of contacts 1605 and 1607 may save process steps over embodiments where they are of different materials.

In some embodiments, contact 1605 maybe omitted where mirror structure 1603 extends to region 203 to serve as a contact to region 203 as well as a full mirror structure. A half mirror structure is a mirror structure that allows a portion of the light to be reflected and a portion of the light to pass through (to wave guide structure 1611 in FIG. 16).

In one embodiment, the openings for mirror structures 1601 and 1603 are slots that run the width (the dimension into and out from the paper of FIG. 16) of laser cavity 1613. Laser cavity 1613 is that portion of layer 701 whose length is defined by mirror structures 1603 and 1601. In one embodiment, the length is approximately 90 micrometers, but may be of other lengths in other embodiments. In other embodiments, other dimensions could be used for different modes or laser wavelengths.

In the embodiment shown, mirrored structures 1601 and 1603 are formed by an in-laid process. In an in-laid process, openings are formed in a structure and material is formed in the opening followed by a removal of any excess material. Utilizing an inlaid process (material fill in an opening) for forming mirror structures 1601 and 1603 advantageously allows for an efficient process for forming a mirrored structure of a laser cavity that is also compatible with a transistor forming process. Furthermore, it allows for the use of the same base layer (e.g. 701) for forming the wave guide and laser cavity material as is used for forming the channels and current terminal regions of subsequently formed transistors.

Figure 17:
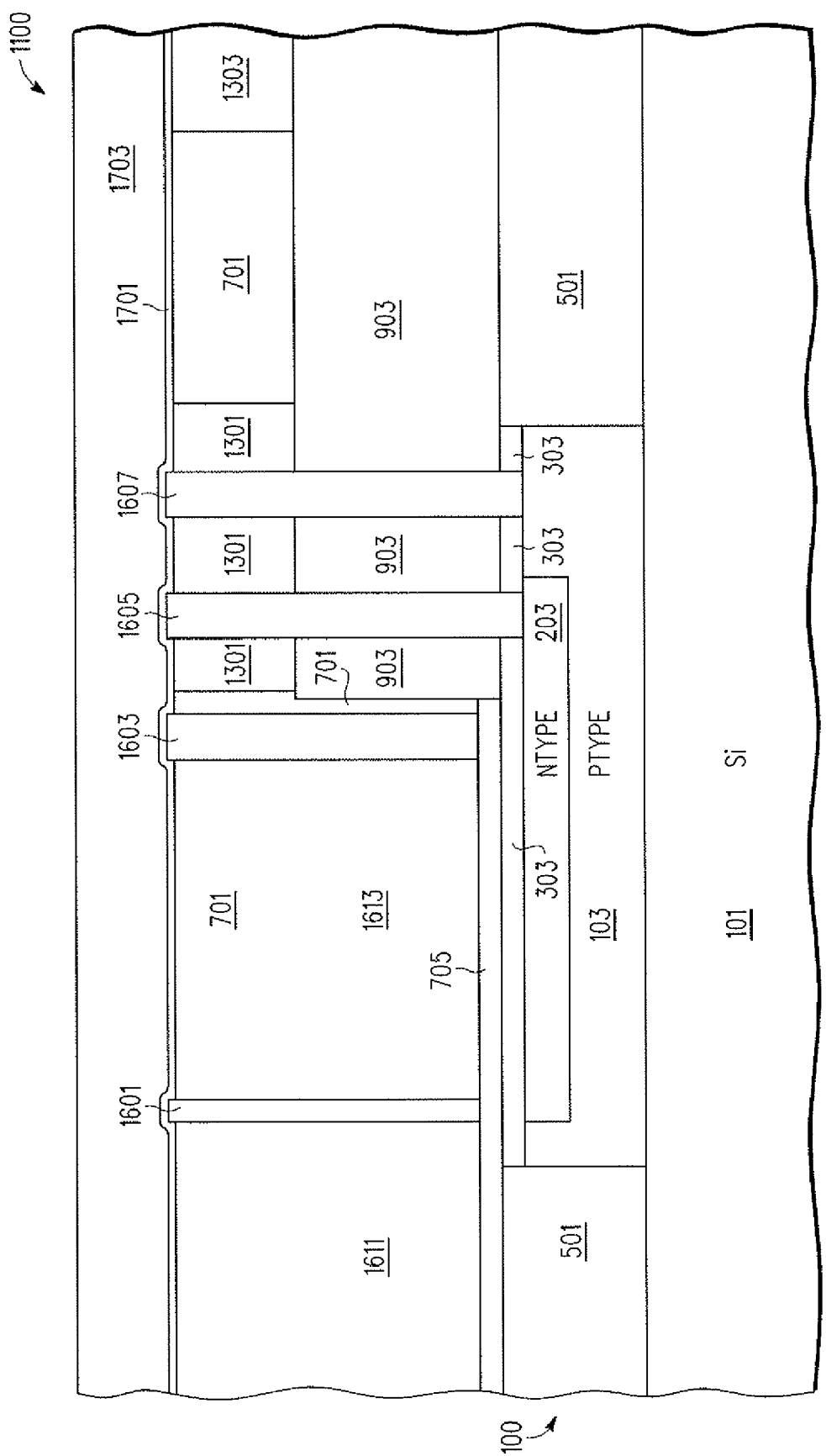

FIG. 17 is a partial cutaway view of wafer 1100 after layer 1307 has been removed and a layer 1701 of gate dielectric material and a layer 1703 of gate material are formed over wafer 1100. In one embodiment, layer 1307 is removed with an appropriate etch chemistry.

The gate dielectric layer 1701 is made of a dielectric material such as silicon dioxide or a high K dielectric (e.g. hafnium oxide). In one embodiment, layer 1701 is 20 angstroms thick, but may be of other suitable thicknesses in other embodiments.

Gate layer 1703 maybe made of any suitable gate material including e.g. polysilicon, metal silicide, and/or metal. In one embodiment layer 1703 is 2000 Å thick, but may be of other thicknesses in other embodiments.

Figure 18:
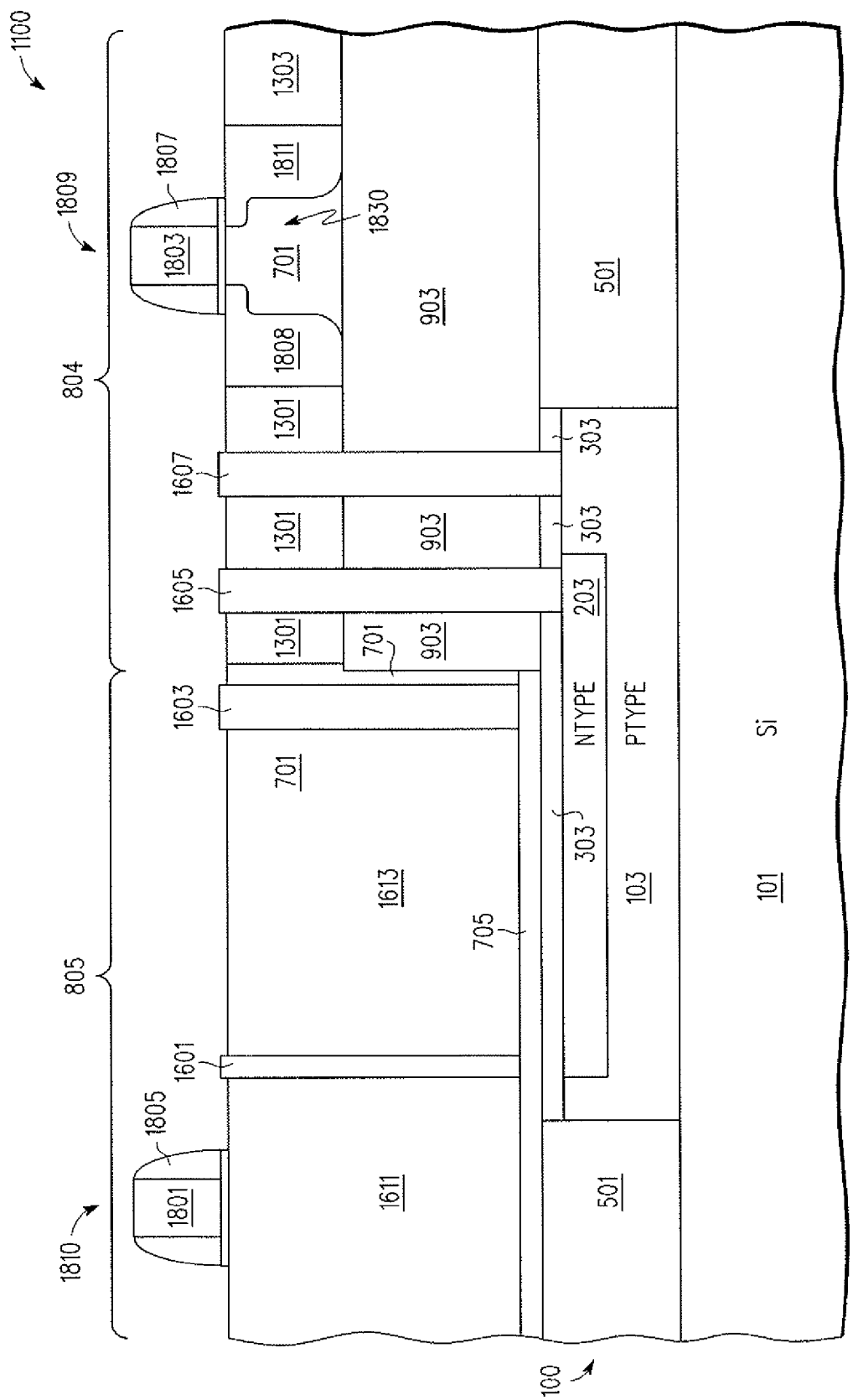

FIG. 18 shows a partial cutaway view of wafer 1100 after a transistor 1809 is formed in section 804 and a modulator capacitor 1810 is formed in section 805. Transistor 1809 includes a gate 1803, spacer 1807, source region 1808, drain region 1811, and a channel region 1830 located under gate 1803 in layer 701 between source region 1808 and drain region 1811. In the embodiment shown, transistor 1809 is a field effect transistor having its current terminal regions (source region 1808 and drain region 1811) and channel region formed in layer 701. Capacitor 1810 includes a capacitor electrode 1801 and spacer 1805. During operation, the function of the second electrode is performed by charge in the wave guide. Gate 1803 and electrode 1801 are formed by patterning gate material layer 1703 to form these structures. After the formation of gate 1803 and electrode 1801, regions 1808 and 1811 are implanted with dopants to form extensions of source region 1808 and drain region 1811. Afterwards, spacers 1805 and 1807 are formed. Following spacer formation, ions for source region 1808 and drain region 1811 are then implanted at higher energies and doses than for the extensions.

In other embodiments, transistor 1809 may have other configurations. For example, transistor 1809 is shown as a fully depleted semiconductor on insulator (SOI) transistor. However, in other embodiments, transistor 1809 may not be fully depleted. Also, in other embodiments, where recess 803 is not formed, the silicon of layer 701 in section 804 would extend to at least the depth of the top of layer 705 in the view of FIG. 18. Still in other embodiments, another semiconductor layer (not shown) may be formed on layer 701 in transistor circuitry section 804. A portion of the channel region 1830 of transistor 1809 would be located in this additional layer.

Figure 19:
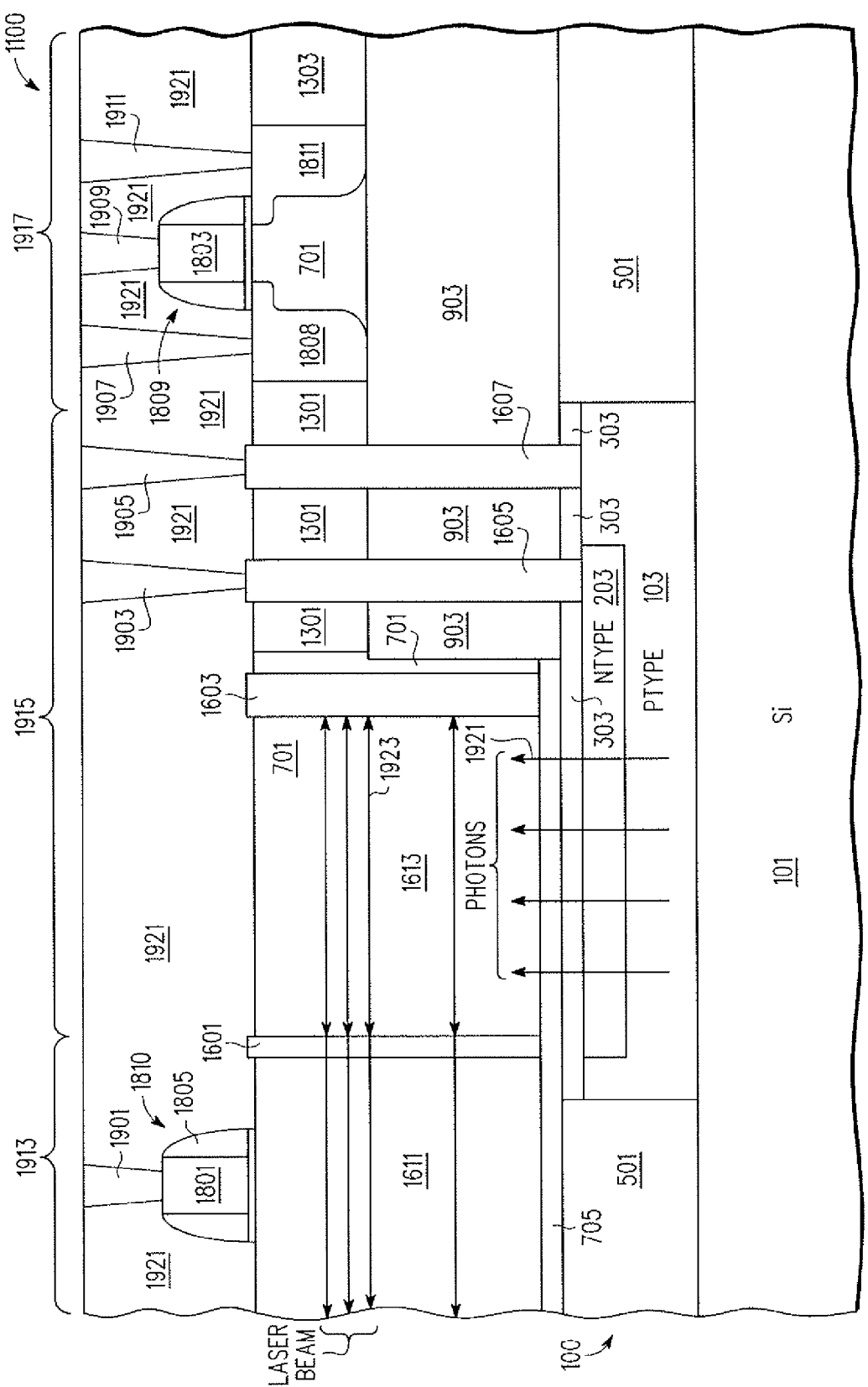

FIG. 19 shows a partial cutaway side view of wafer 1100 after an initial dielectric layer 1921 is formed on wafer 1100 and contacts are formed to electrically contact conductive structures. In the embodiment shown, layer 1921 is formed from a dielectric material (e.g. tetra-ethyl-ortho-silicate (TEOS), boron phosphorous doped TEOS, or silicon oxide) that is deposited on wafer 1100. Openings are then formed to expose electrode 1801, contact 1605, contact 1607, source region 1808, drain region 1811, and gate 1803. In some embodiments, electrode 1801, gate 1803, source region 1808, and drain region 1811 are silicided prior to the deposition of layer 1921. In one embodiment, contacts 1901, 1903, 1905, 1907, and 1911 are formed of a suitable material (e.g. tungsten) and may include a barrier layer (e.g. titanium, tantalum, or nitrides thereof).

Afterwards, other interconnect layers including conductive interconnects and interlayer dielectrics are formed over wafer 1100. These interconnects electrically couple the contacts in layer 1921 to other devices of wafer 1100 (not shown). For example, the electrodes of transistor 1809 may be coupled to the electrodes of other transistors and to capacitor electrodes at other locations in wafer 1100. Afterwards, external die connectors (e.g. bond pads, bumps) for external connection may be formed after forming the interconnect layers. Wafer 1100 may be singulated into multiple integrated circuit die with each die including multiple transistors similar to transistor 1809, a laser diode structure similar to structure 401, wave guide structures similar to structure 1611, a laser cavity similar to cavity 1613, and a modulating capacitor similar to capacitor 1810.

In FIG. 19, P type region 103 and N type region 203 are biased at different voltages to produce photons that are emitted into laser cavity 1613 through oxide layers 303 and 705. In one embodiment, the combined thickness of layers 303 and 705 is approximately 35 Å, but may be of other thicknesses in other embodiments. These photons are fully reflected by full mirror structure 1603 as well as layer 1921 and partially reflected by half mirror structure 1601. The portion of the photons not reflected by half mirror structure 1601 pass through to wave guide structure 1611 to produce a laser beam that is modulated by modulating capacitor 1810 and is transmitted to the edge of the die for transmission to other integrated circuits. Utilization of mirror structure 1603 and half mirror structure 1601 provides for amplification of the photons for producing a laser beam in wave guide structure 1611.

Figure 20:
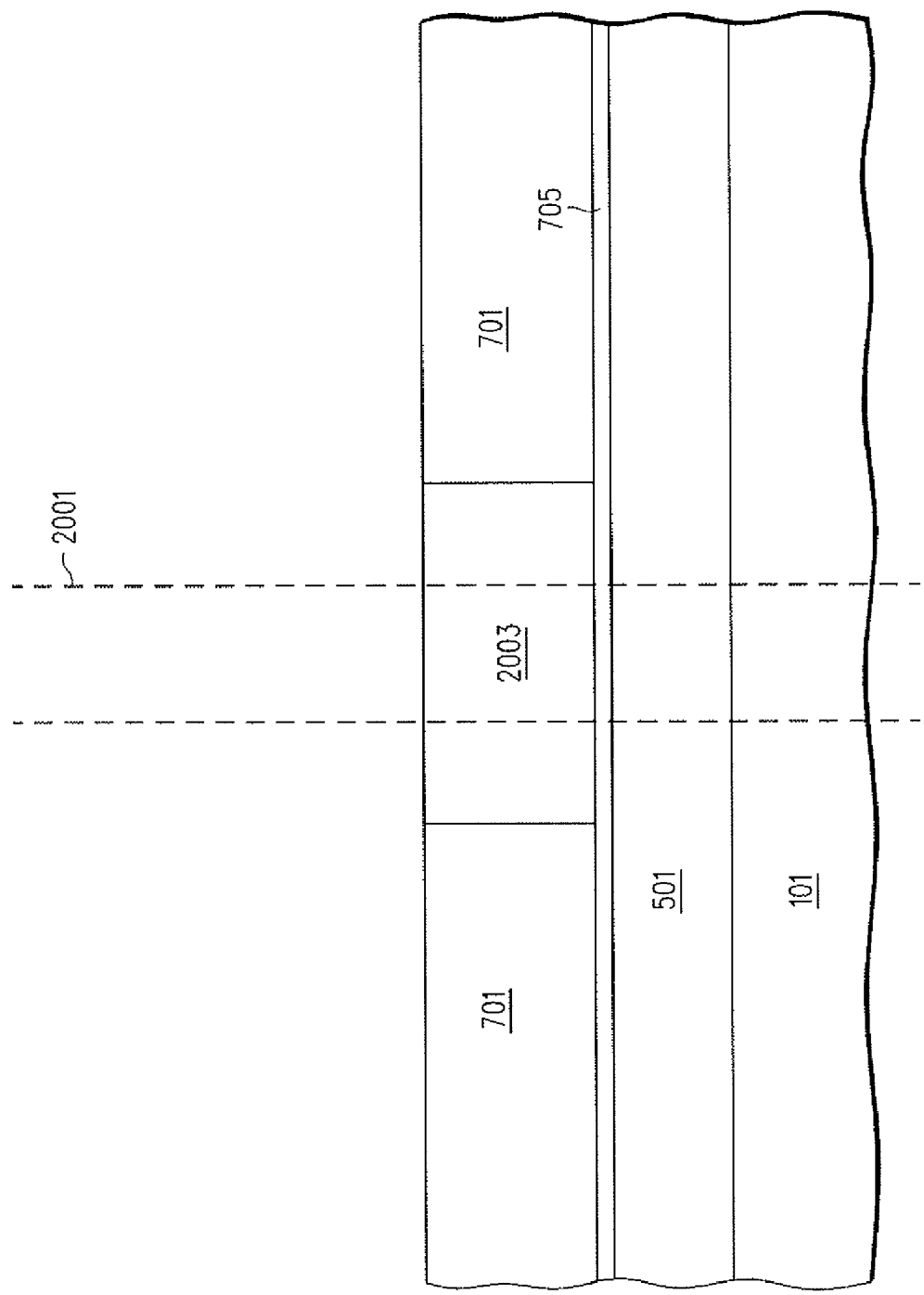
Figure 21:
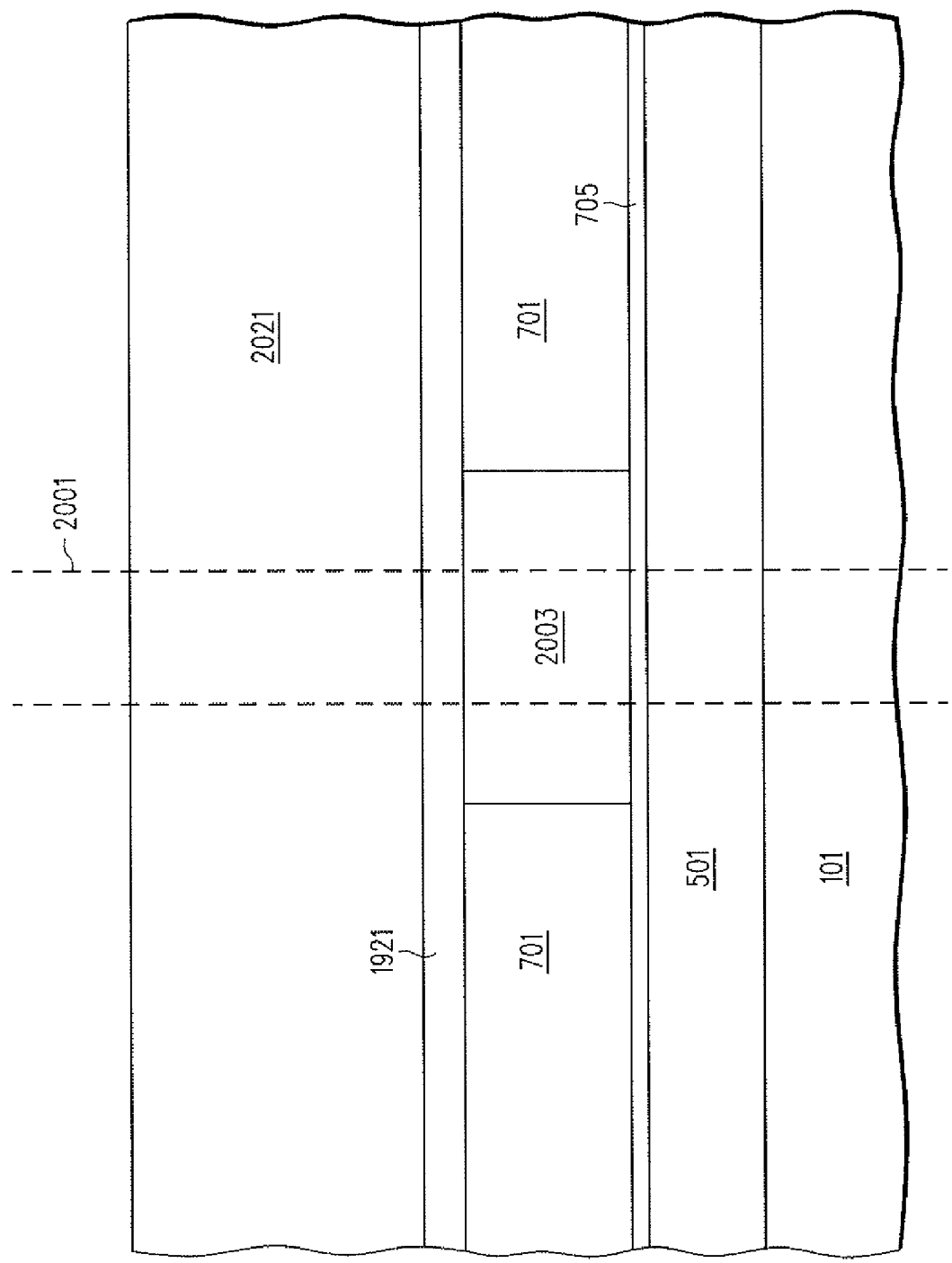
Figure 22:
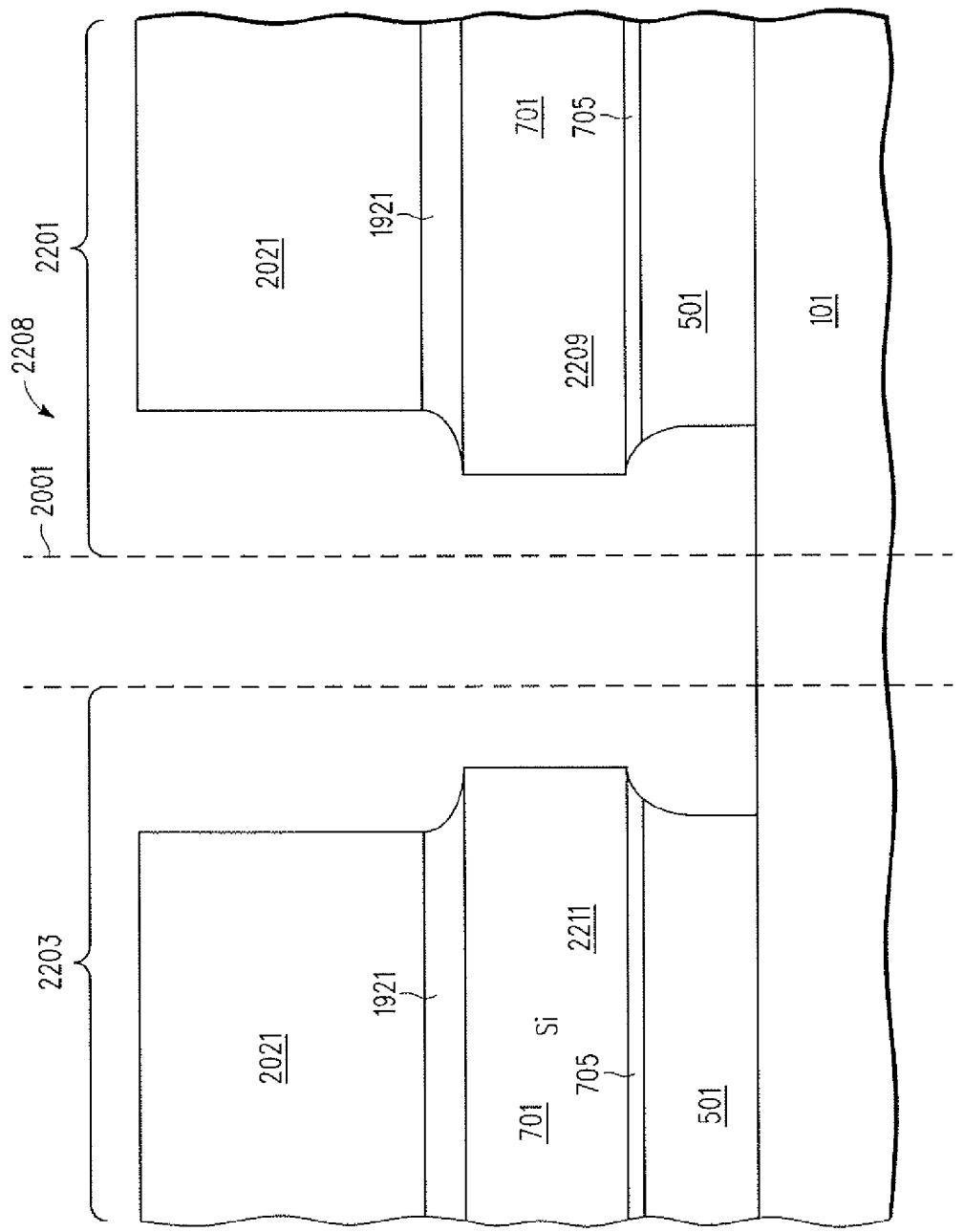

FIGS. 20-22 are partial side views of wafer 1100 at a location where two portions are to be separated to form two integrated circuit die during singulation. In the embodiment shown, FIG. 20 is at the stage of manufacture just after the formation of trench isolation structures (e.g. 1301 and 1303 of FIG. 13). Path 2001 is the path that a saw blade will take for singulating wafer 1100 to form separate die. A trench isolation structure 2003 is formed in layer 701 during the formation of isolation structures 1301 and 1303. Trench structure 2003 separates layer 701 into two separate wave guide portions 2007 and 2009 which will be wave guide structures for each die.

FIG. 21 is another side view of wafer 1100 at the same location of FIG. 20 after the formation of dielectric layer 1921 and interconnect layer 2021. Interconnect layer 2021 includes the inter-level dielectric material for the one or more interconnect layers located above layer 2021 in the transistor circuitry sections (e.g. 804) and optical regions (e.g. 805) of wafer 1100. Because the view of wafer 1100 is located at the edge of two die, no transistors are shown in FIG. 21.

FIG. 22 is a partial cutaway side view of wafer 1100 after an opening 2208 is formed in layers 2021, 1921, structure 2003, layer 705, and layer 501 to expose the sides of wave guide structures 2211 and 2209. Opening 2208 is formed by masking areas outside the location of opening 2208 and etching those layers with etch chemistries suitable to remove those materials and are selective to the mask material (not shown) and the silicon of layer 701 and substrate 101 (when those layers are exposed). In the embodiment shown, at least a portion of the etching is performed with an isotropic etch chemistry, which under cuts beneath layer 701. Structure 2003 is etched to expose the ends of wave guide structures 2211 and 2209, which extend out from the side walls of each die 2203 and 2201.

After the formation of opening 2208, wafer 1100 is singulated with a saw along saw path 2001 to form integrated circuit die 2203 and 2201. During the sawing of wafer 1100, the saw (not shown), does not touch layer 701, thereby leaving untouched the sidewall surfaces of wave guide structures 2211 and 2209. Thus, these sidewalls have a smoother surface that is not damaged by a saw blade.

In some embodiments, only one side of the saw path 2001 would include a wave guide structure. For example in FIG. 22, die 2201 would include a wave guide structure 2209 but die 2203 would not include a wave guide structure at the location shown in FIG. 22. Its wave guide structure would be located at the opposite side of die 2203.

Figure 23:
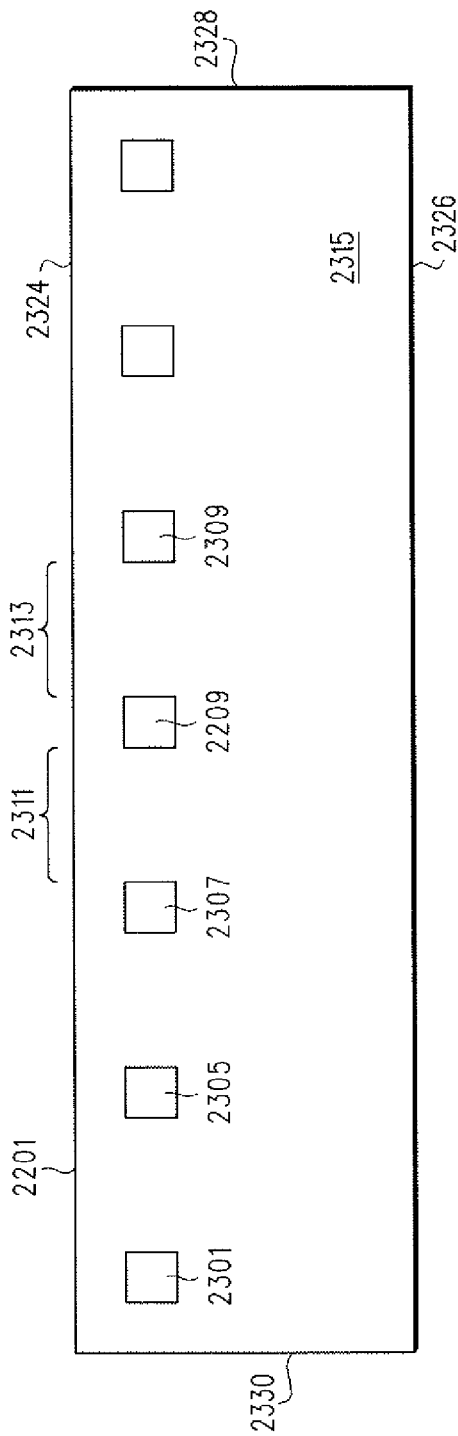
FIG. 23 is a side view of an integrated circuit die according to one embodiment of the present invention.

FIG. 23 shows a side view of the edge of an integrated circuit die 2201 after singulation from wafer 1100. Die 2201 includes major sides 2324 and 2326 and non major sides 2328 and 2330. Die 2201 includes a number of wave guide structures 2301, 2305, 2307, 2209, and 2309 exposed at sidewall 2315 of die 2201. Each wave guide structure is for transmitting a laser beam generated by either the same or different laser transmitter (not shown in FIG. 23) located in die 2201 and modulated by a different modulating capacitor. Each wave guide structure is for providing information for a different communications link to transmit information that is generated by the circuitry of die 2201. In the embodiment shown, a laser beam emanates from each wave guide structure in a direction that is parallel to the major sides 2324 and 2326.

In the embodiment shown, each wave guide structure is spaced apart from another wave guide structure. Located in the areas of die 2301 between each wave guide structure are core areas (e.g. 2311 and 2313). Each core area includes one or more processor cores for generating information to be transferred by each wave guide.

The singulated IC die may be packaged into integrated circuit packages. In one embodiment, a die would be positioned on a lead frame or other packaging substrate to where the wave guides would be aligned with a receiver of another integrated circuit of the package. An optically conducting path would be formed between the two die to allow for photons of an optical link to pass between the integrated circuit die. In one embodiment, the space between the die would be an air cavity. In another embodiment, optically conductive material would be located between the die. In such embodiments, the integrated circuit die would communicate information between each other by an optical link.

In another embodiment, each die would be packaged such that a laser beam radiating from a wave guide structure (e.g. 2209) at the edge of the die would pass through the edge of the package to other integrated circuit packages of a system. For example, in a computer system, photons leaving one package would be transmitted over free space to another package. See for example, the patent application entitled "Free-Space Optical Communication System," having inventors Perry H. Pelley and Lucio Pesso, having a common assignee, and having the same filing date, all of which is incorporated by reference in its entirety. With such an embodiment, die 2201 would packaged such that the die edge wave guide structures (e.g. 2209, 2301, 2305) would be exposed from the edge of the package. In other embodiments, optically conductive material would be located between the die edge wave guide structure and the package edge such that a laser beam would be able to travel from the die edge wave guide structures to the package edge.

In the embodiment shown, a laser beam is transmitted out from the die edge wave guides structure (e.g. 2209) in a direction that is generally parallel to a major side (2324 and 2326) of die 2201. Accordingly, this may allow for communication between two die whose major sides are mounted generally parallel on a board (e.g. a pc board). In one embodiment, this may be transmitted into free space or other optically transparent medium such as e.g. liquid coolant or wave guide.

Figure 24:
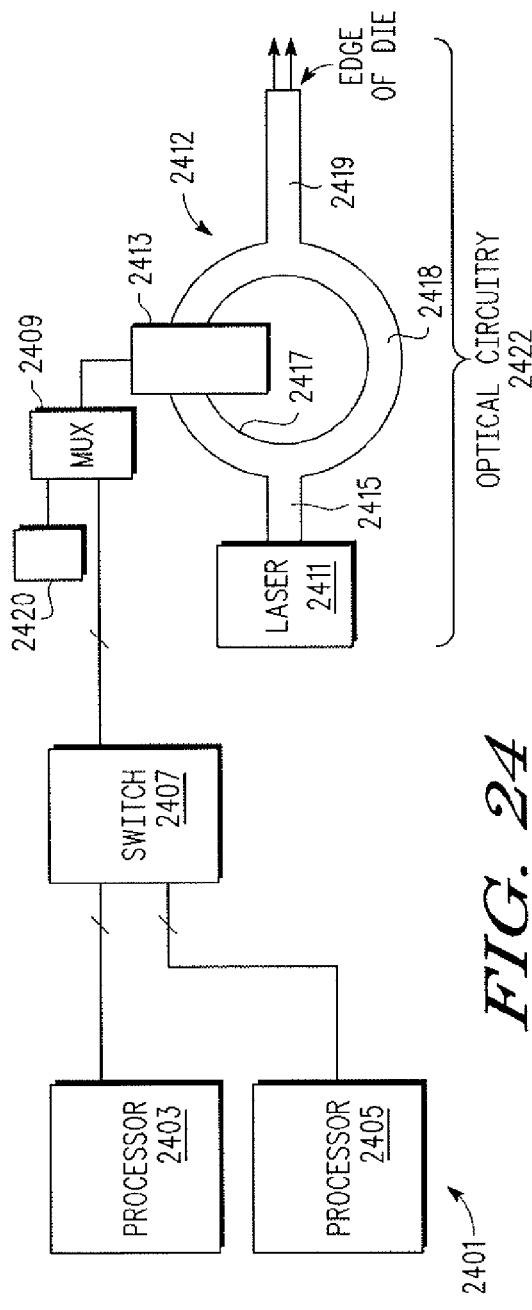
FIG. 24 is a circuit diagram according to one embodiment of the present invention.

FIG. 24 is a block diagram of a system 2401 that utilizes a laser transmitter 2411 that includes a laser diode similar to the one of structure 401 and a laser cavity similar to cavity 1613. System 2401 includes two processor cores 2403 and 2405 a communication switch circuit 2407, a multiplexer 2409, a modulator 2413. In one embodiment, modulator 2413 includes a modulating capacitor similar to capacitor 1810. The system also includes a wave guide 2412 that includes wave guide segments 2415, 2417, 2418, and 2419. Segment 2419 extends out towards the end of a die. In one embodiment, processor core 2403, processor core 2405, multiplexer 2409, and switch 2407 includes a transistor similar to transistor 1809. Multiplexer 2409 has an input coupled to a clock 2420. In one embodiment, clock 2420 has a clock speed of greater than 20 Gigahertz.

During the operation of system 2401, processor cores 2403 and 2405 perform information handling operations which generate information to be transmitted outside of system 2401 by optical circuitry 2422 (laser transmitter 2411, multiplexer 2409, modulating capacitor, and wave guide 2412). In one embodiment, each of processor core 2403 and processor core 2405 provides information (over a parallel bus in the embodiment shown) to switch 2407. Switch 2407 determines which information is to be transmitted by optical circuitry 2422 at a particular time and provides that information on its outputs to multiplexer 2409. During the transmission of information, the P Type and N Type regions of a laser diode of laser transmitter 2411 are biased at different voltages to produce photons to generate a laser beam that passes into wave guide 2412 at segment 2415. The wave guide shown in FIG. 24 has a split configuration where a portion of the laser beam passes to segment 2419 through circular segment 2418 and a portion of the laser beam passes through to segment 2419 through circular segment 2417. In some embodiments, segments 2417 and 2418 may be of different lengths.

In one embodiment, multiplexer 2409 samples each of the input lines at a high frequency and drives the modulator 2413 at the frequency (20 Giga hertz or greater) of the input clock to encode information onto the laser beam to be transmitted though wave guide 2412 to the edge of the die.

In one embodiment, the modulating capacitor of modulator 2413 is voltage switched by multiplexer 2409 as per the information sampled by multiplexer 2409 to phase shift the wavelength of the laser beam in segment 2417. The phase shifted laser beam is combined with the unshifted laser beam of segment 2418 wherein their combination produces information pulses at the frequency of the modulator with a timing that is indicative of the information to be transmitted.

In other embodiments, the optical devices may be configured in other ways and/or operate differently to encode information to be conveyed by a laser beam. The laser diode may be made by other materials (e.g. InGaP, GaAs etc.) to produce a laser beam of different wavelengths. In other embodiments, the dimensions of the laser cavity may be varied slightly to produce different wavelengths.

In the embodiment shown, system 2401 is located on a single die. Locating the system on a single die allows for a more efficient communication of information on the optical link, thereby providing a greater output of data. With prior art systems, the optical circuitry 2422 would be located on a different die than the processor cores. Such a system is less efficient in that information has to be transmitted electrically between die before it can be transmitted by a laser transmitter. Also, the system shown here is more compact in that the devices are integrated on one die, there by reducing size and manufacturing costs.

Furthermore, the processes described herein allow for the manufacture of a die with both transistor circuitry and optical circuitry that utilize some of the same layers and processes for making structures of both sections, thereby reducing complexity and manufacturing operations.

In one embodiment, an apparatus includes a transistor circuitry section for implementing information handling operations. The transistor circuitry section is located within a single semiconductor die. The apparatus also includes optical circuitry within the single semiconductor die and comprising a laser transmitter. The transistor circuitry section is for originating information and the optical circuitry is for optically transmitting the information through a plane generally parallel to a major side of the single semiconductor die.

In another embodiment, a method includes providing a laser diode of a laser in a first wafer and providing a second wafer. The second wafer includes a semiconductor layer portion. The method includes bonding the first wafer and the second wafer together at an interface to form a composite wafer including the semiconductor layer portion and the laser diode. The method also includes forming a wave guide from the semiconductor layer portion. The wave guide is for carrying photons generated by the laser diode. The method also includes forming a transistor on the composite wafer. The transistor includes a channel region at least partially located in the semiconductor layer portion.

In another embodiment, a method includes providing a transistor circuitry section within a single semiconductor die. The transistor circuitry section including transistors having at least a portion of a channel region in a layer of semiconductor material. The transistor circuitry section includes circuitry for implementing information handling operations. The method includes providing an optical section within the single semiconductor die. The optical section comprises a laser diode, a laser cavity in proximity to the laser diode to receive photons from the laser diode, and a wave guide extending laterally from the laser cavity for optically transmitting an information signal. The wave guide is formed from the layer of semiconductor material.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An apparatus comprising:
    a transistor circuitry section for implementing information handling operations, the transistor circuitry section located within a single semiconductor die; and
    optical circuitry within the single semiconductor die and comprising a laser transmitter, the transistor circuitry section for originating information and the optical circuitry for optically transmitting the information through a plane generally parallel to a major side of the single semiconductor die;
    wherein the optical circuitry further comprises a laser diode positioned underlying a semiconductor layer, wherein the semiconductor layer includes at least portions of channel regions of transistors in the transistor circuitry section.

2. The apparatus of claim 1 wherein the optical circuitry further comprises a laser cavity having a length defined by first and second in-laid mirrors.

3. The apparatus of claim 1 wherein the laser transmitter further comprises:
    a laser diode formed in the single semiconductor die for producing photons for a laser beam;
    a modulator having an input for receiving a signal containing the information and having an output for modulating the laser beam to encode the information in the laser beam; and
    a wave guide extending to an edge of the single integrated circuit die, for providing an optical pathway for the laser beam with the encoded information to the edge of the single integrated circuit die.

4. The apparatus of claim 3 wherein the modulator further comprises a modulating capacitor for modulating the laser beam in the wave guide, wherein a control electrode of a transistor within the transistor circuitry section and an electrode of the modulating capacitor comprise a same material and each include portions located in a same plane generally parallel to a major side of the single integrated circuit die.

5. The apparatus of claim 3 further comprising:
    a multiplexer having an input for receiving information, a clock input for receiving an input clock, and an output coupled to the input of the modulator for driving the modulator at a data rate of 20 Giga hertz or greater.

6. The apparatus of claim 5 further comprising:
    two or more data processor cores implemented within the transistor circuitry section of the single semiconductor die;
    a switch coupled to the two or more data processor cores and selectively providing information from each of the two or more data processor cores at an output thereof;
    wherein the input of the multiplexer is coupled to the output of the switch.

7. The apparatus of claim 3 wherein the wave guide has a split wave guide configuration including a first split portion and a second split portion, wherein the modulator phase shifts the laser beam in the first split portion and does not phase shift the laser beam in the second split portion.

8. The apparatus of claim 1 wherein laser transmitter includes a laser cavity formed in a semiconductor layer wherein at least a portion of a channel region of a transistor of in the transistor circuitry section is located in the semiconductor layer.

9. The apparatus of claim 1 wherein laser transmitter includes a wave guide formed in a semiconductor layer wherein at least a portion of a channel region of a transistor of in the transistor circuitry section is located in the semiconductor layer.

10. A method comprising:
    providing a laser diode of a laser in a first wafer;
    providing a second wafer, the second wafer including a semiconductor layer portion;
    bonding the first wafer and the second wafer together at an interface to form a composite wafer including the semiconductor layer portion and the laser diode;

forming a wave guide from the semiconductor layer portion, the wave guide for carrying photons generated by the laser diode;
forming a transistor on the composite wafer, the transistor including a channel region at least partially located in the semiconductor layer portion.

11. The method of claim 10 further comprising:
forming a half reflecting in-laid mirror and a fully reflecting in-laid mirror to define a laser cavity in the semiconductor layer portion, the laser cavity positioned to receive photons generated by the laser diode.

12. The method of claim 10 further comprising:
etching a selected area of the semiconductor layer portion prior to bonding the first wafer and the second wafer together to determine a depth of current terminal regions of the transistor in the semiconductor layer portion.

13. The method of claim 10 wherein the wave guide includes a wave guide end formed by etching the semiconductor layer portion, the method comprising:
sawing the composite wafer to form a plurality of integrated circuit die, wherein the wave guide end is located in a first die of the plurality of integrated circuit die, wherein the sawing does not contact the wave guide end, wherein the sawing leaves the wave guide end exposed, wherein the wave guide end is located on a non major side of the first die.

14. The method of claim 10 further comprising:
forming a modulator in the composite wafer, wherein the wave guide is coupled to an output of a modulator for modulating a laser beam carried by the wave guide, the modulator further comprising an input;
forming a multiplexer in the composite wafer, the multiplexer having an output coupled to the input of the modulator;
forming a processor core in the composite wafer, the transistor is located in the processor core, the modulator is operably coupled to received information generated by the processor core.

15. A method comprising:
providing a transistor circuitry section within a single semiconductor die, the transistor circuitry section including transistors having at least a portion of a channel region in a layer of semiconductor material, the transistor circuitry section including circuitry for implementing information handling operations; and
providing an optical section within the single semiconductor die, the optical section comprising a laser diode, a laser cavity in proximity to the laser diode to receive photons from the laser diode, and a wave guide extending laterally from the laser cavity for optically transmitting an information signal, wherein the wave guide is formed from the layer of semiconductor material.

16. The method of claim 15 further comprising:
providing a modulator within the single semiconductor die, wherein the wave guide is coupled to an output of a modulator for phase shifting a laser beam in the wave guide.

17. The method of claim 16 further comprising:
wherein the modulator includes a modulating capacitor, wherein a control electrode of a transistor within the transistor circuitry section and an electrode of the modulating capacitor are formed from a first layer of material.

18. The method of claim 15 further comprising:
defining a length of the laser cavity by in-laying first and second mirrors in the layer of semiconductor material.

19. The method of claim 18 further comprising:
forming the first mirror as a half-reflecting mirror; and
forming the second mirror as a fully-reflecting mirror.

20. The method of claim 15 further comprising:
forming one or more fully depleted SOI transistors in the transistor circuitry section.

* * * * *